(12) United States Patent
Yang et al.

(10) Patent No.: US 12,211,951 B2
(45) Date of Patent: Jan. 28, 2025

(54) ASSEMBLY CHAMBER FOR SELF-ASSEMBLY OF SEMICONDUCTOR LIGHT-EMITTING DIODES

(71) Applicant: LG ELECTRONICS INC., Seoul (KR)

(72) Inventors: Inbum Yang, Seoul (KR); Junghun Rho, Seoul (KR); Sangsik Jung, Seoul (KR); Bongwoon Choi, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 298 days.

(21) Appl. No.: 17/761,839

(22) PCT Filed: Feb. 13, 2020

(86) PCT No.: PCT/KR2020/002017
§ 371 (c)(1),
(2) Date: Mar. 18, 2022

(87) PCT Pub. No.: WO2021/054546
PCT Pub. Date: Mar. 25, 2021

(65) Prior Publication Data
US 2022/0328716 A1    Oct. 13, 2022

(30) Foreign Application Priority Data

Sep. 19, 2019 (KR) .................. 10-2019-0115574
Nov. 28, 2019 (KR) .................. 10-2019-0156076

(51) Int. Cl.
*H01L 33/00* (2010.01)
*H01L 21/67* (2006.01)
*H01L 21/673* (2006.01)

(52) U.S. Cl.
CPC .... *H01L 33/0095* (2013.01); *H01L 21/67017* (2013.01); *H01L 21/67356* (2013.01)

(58) Field of Classification Search
CPC ......... H01L 21/67017; H01L 21/67144; H01L 21/67356; H01L 2224/95101; H01L 25/0753; H01L 33/0095
See application file for complete search history.

(56) References Cited

U.S. PATENT DOCUMENTS 9,825,202 B2   11/2017   Schuele et al.
10,243,097 B2   3/2019   Yuen
(Continued)

FOREIGN PATENT DOCUMENTS

JP       2006307299 A  * 11/2006
KR   10-1998-0013907 A    5/1998
(Continued)

*Primary Examiner* — Minh N Trinh
(74) *Attorney, Agent, or Firm* — Birch, Stewart, Kolasch & Birch, LLP

(57) ABSTRACT

Discussed is an assembly chamber containing a fluid. The assembly chamber includes a bottom portion, a side wall portion formed at a predetermined height on the bottom portion and disposed to surround the bottom portion, and a partition wall part formed on the bottom portion and extending from one inner surface of a plurality of inner surfaces provided in the side wall portion to another inner surface facing the one inner surface. The vertical height of at least a portion of the partition wall part is variable with respect to the bottom portion.

19 Claims, 24 Drawing Sheets

(56) References Cited

U.S. PATENT DOCUMENTS

2017/0372927 A1 12/2017 Schuele et al.
2018/0076068 A1* 3/2018 Yuen .................. H01L 25/0753
2022/0328716 A1* 10/2022 Yang ................. H01L 21/67017

FOREIGN PATENT DOCUMENTS

| KR | 10-0932121 B1 | 12/2009 |
| KR | 10-2012-0014388 A | 2/2012 |
| KR | 10-2014-0032837 A | 3/2014 |

* cited by examiner

【Figure 1】
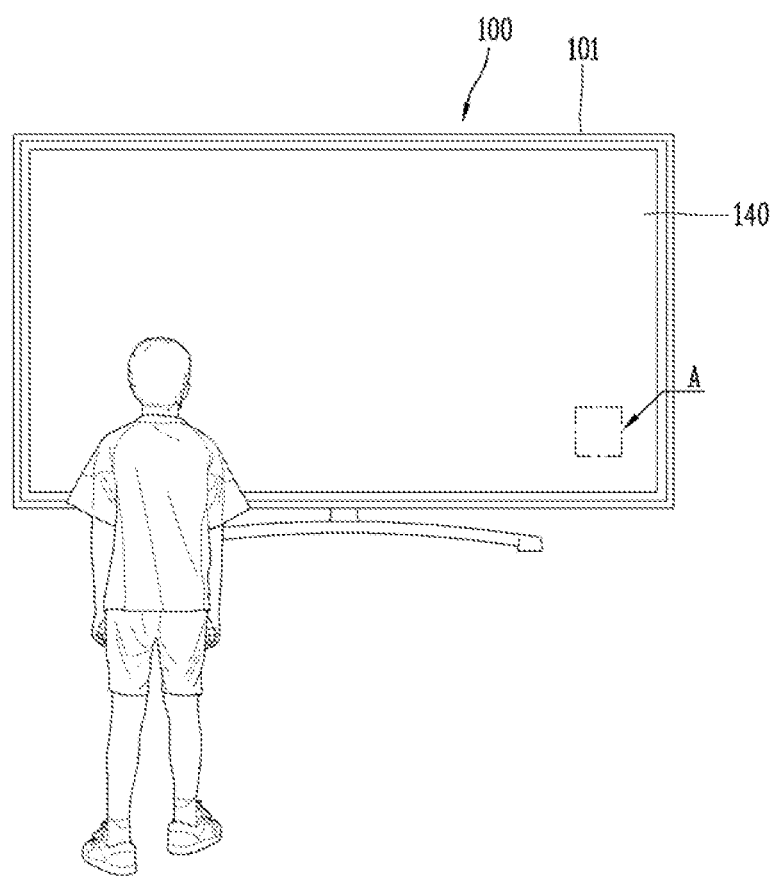

【Figure 2】
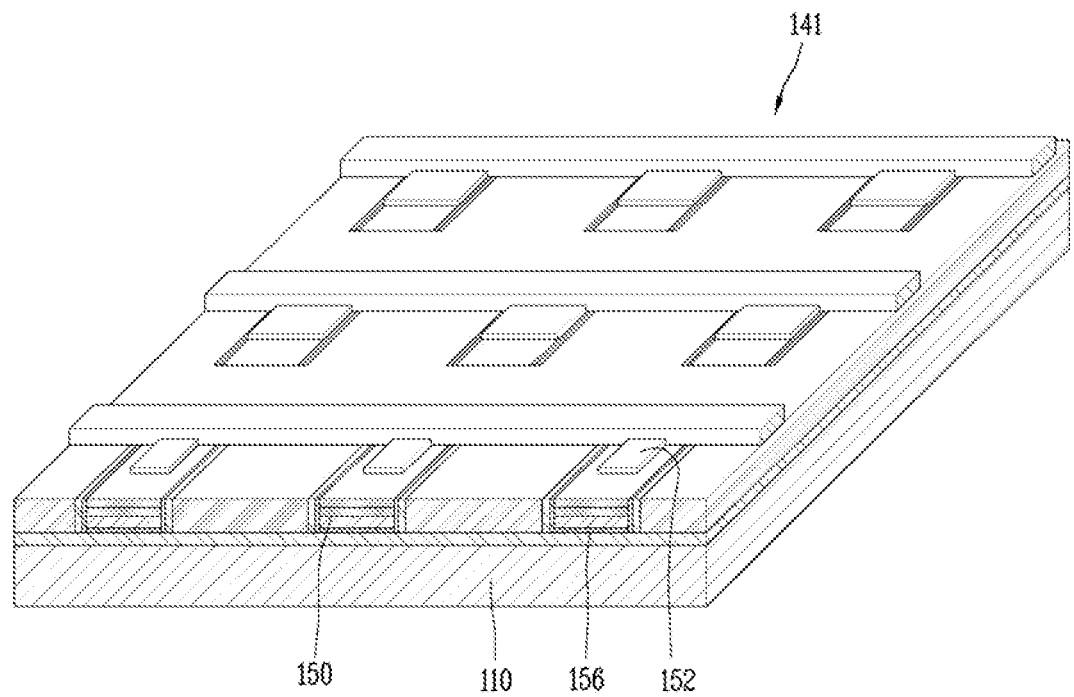
【Figure 3】
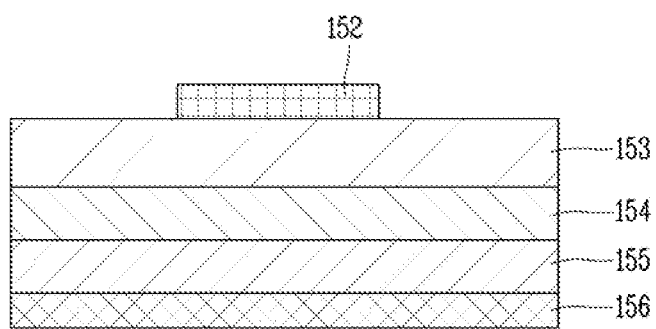

【Figure 4】
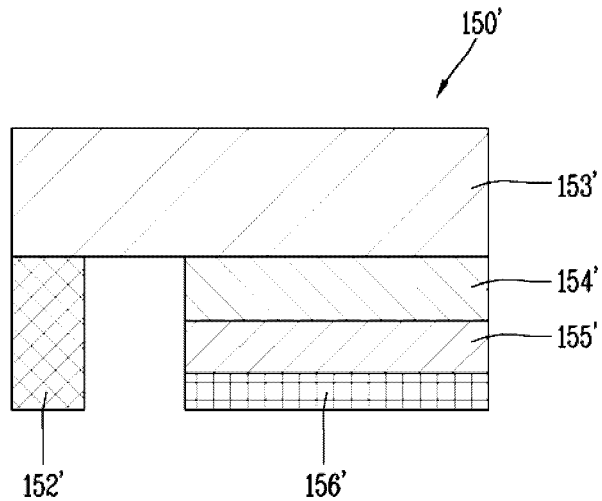
【Figure 5A】
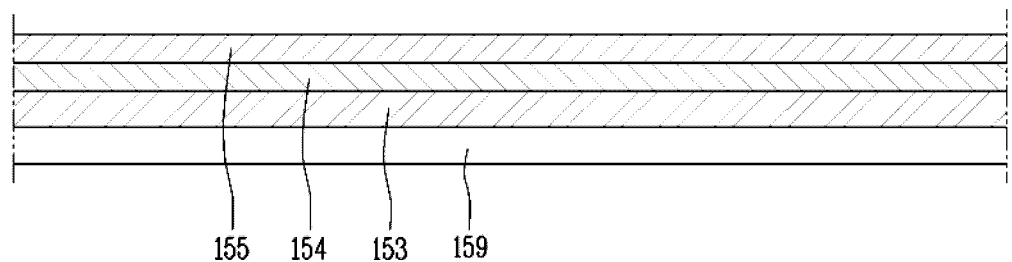
【Figure 5B】
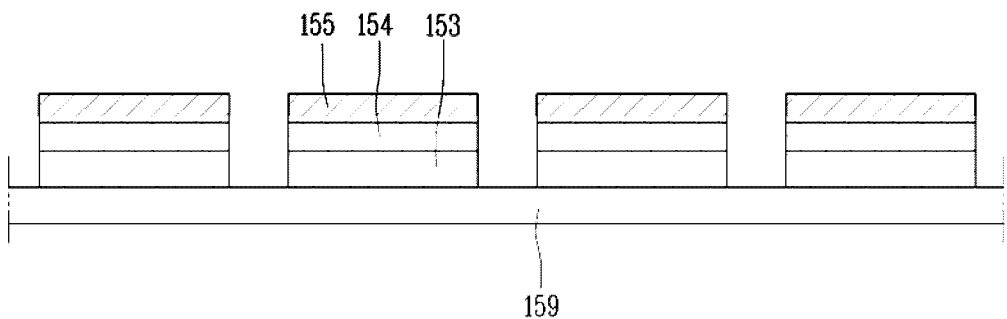

[Figure 5C]
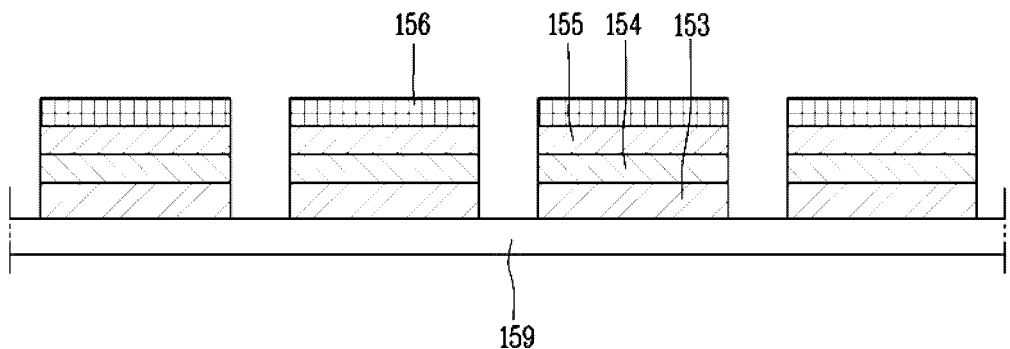
[Figure 5D]
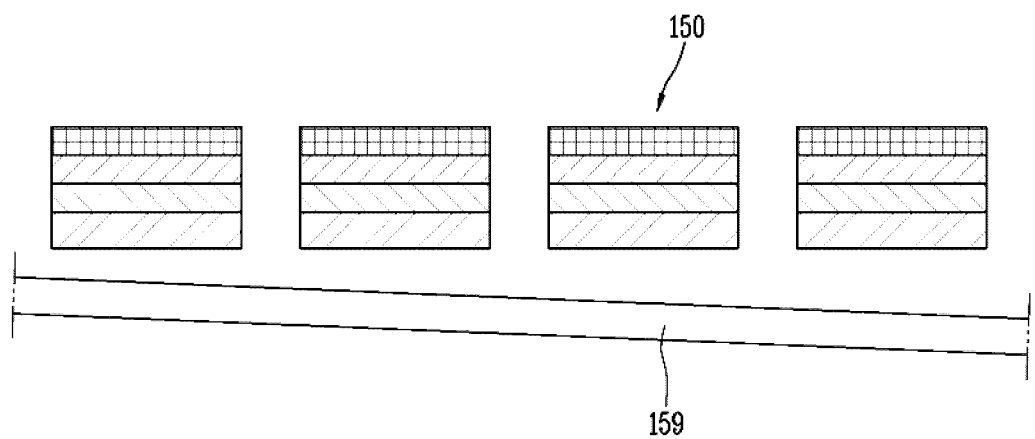
[Figure 5E]
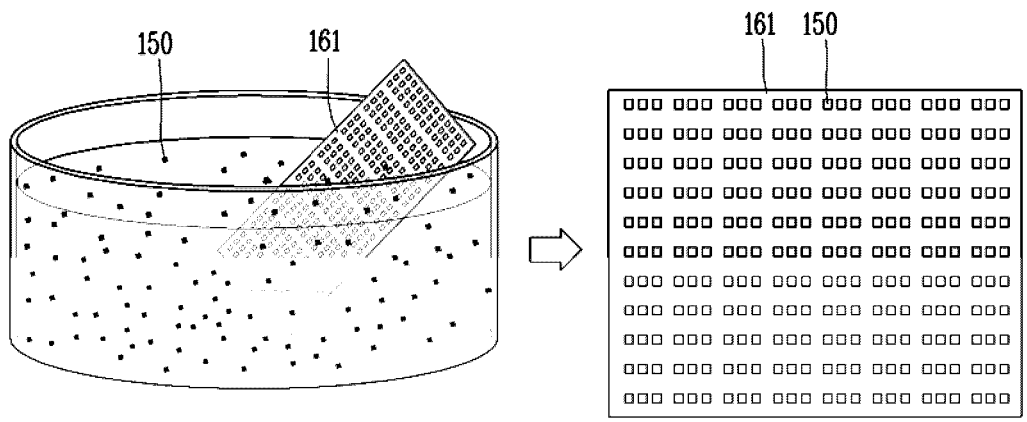

[Figure 6]
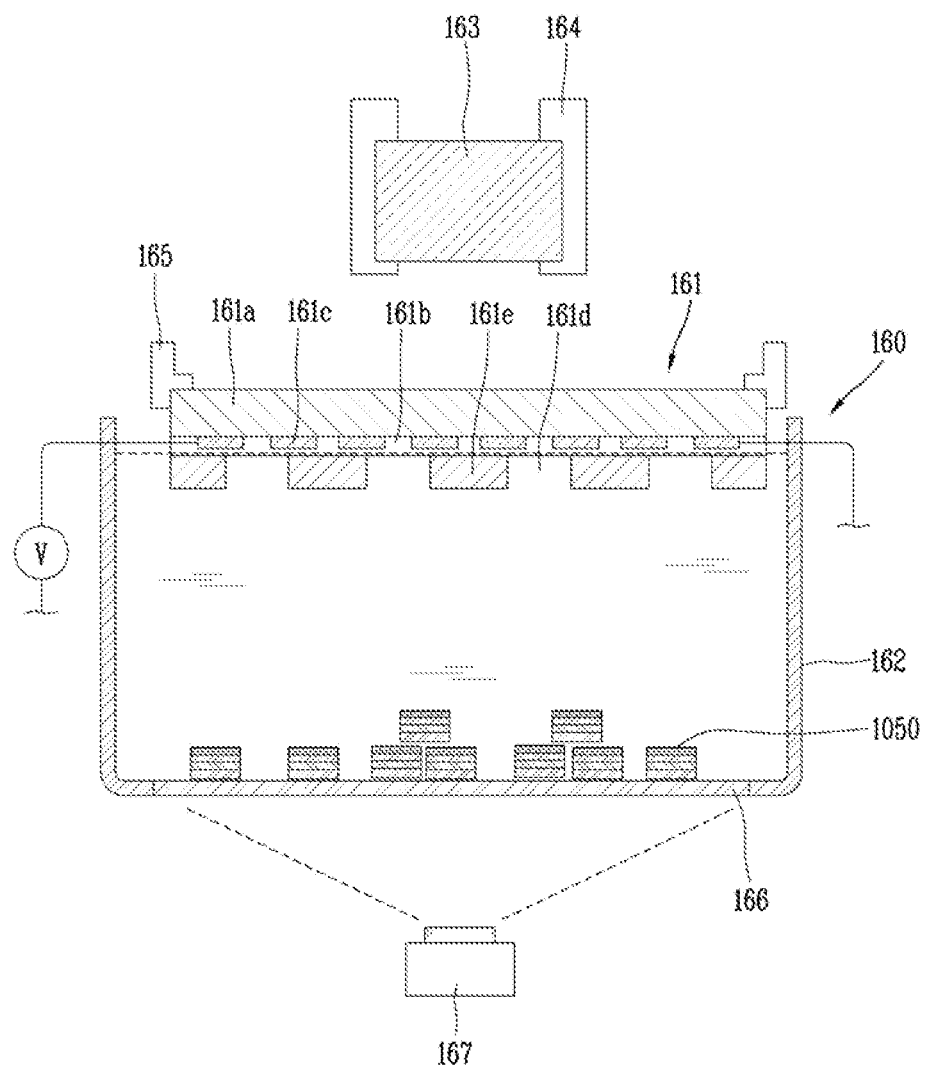

[Figure 7]
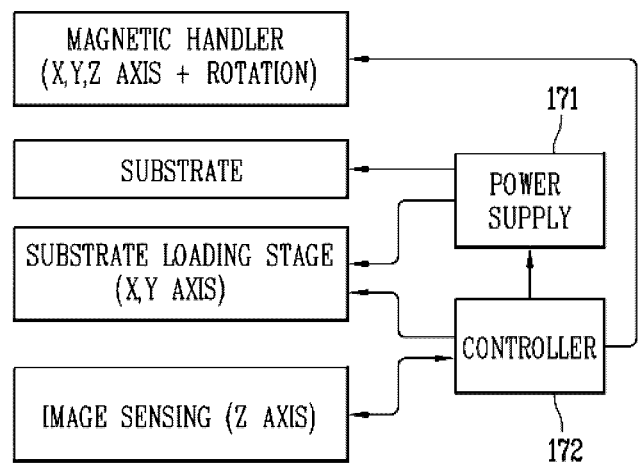
[Figure 8A]
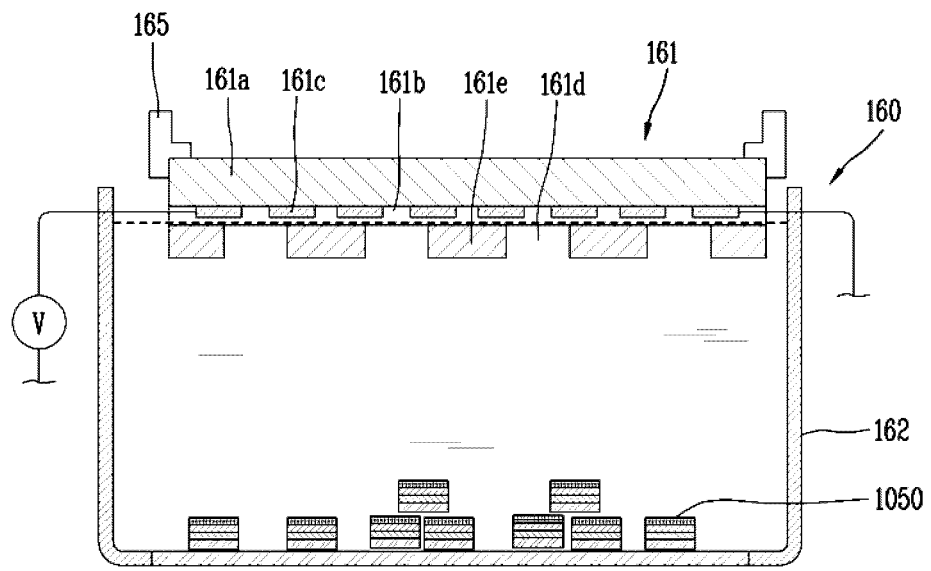

【Figure 8B】
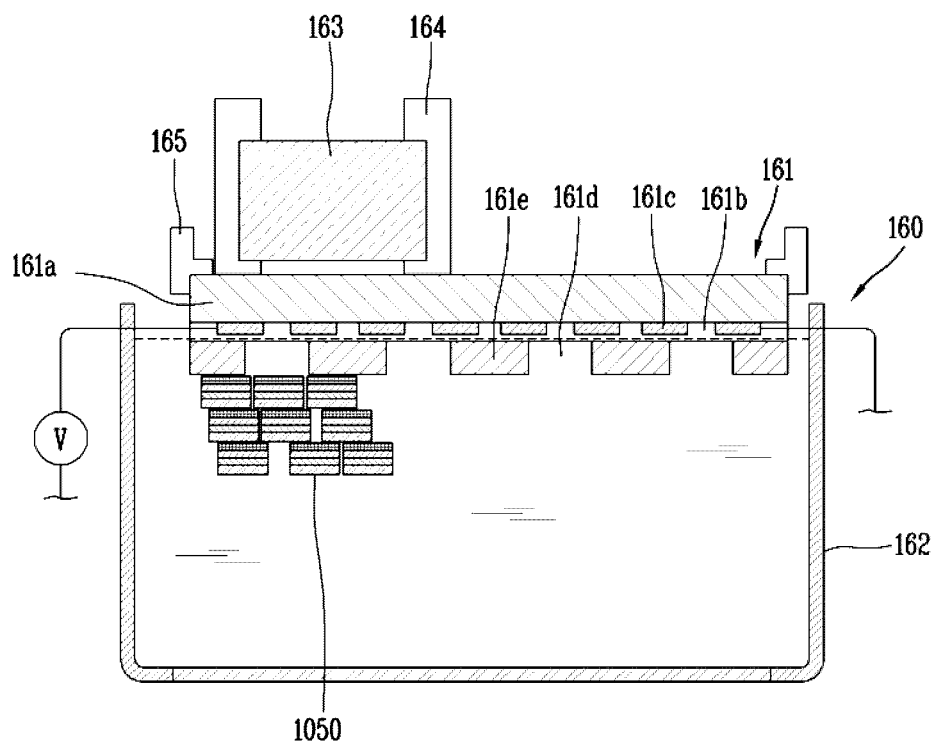

【Figure 8C】
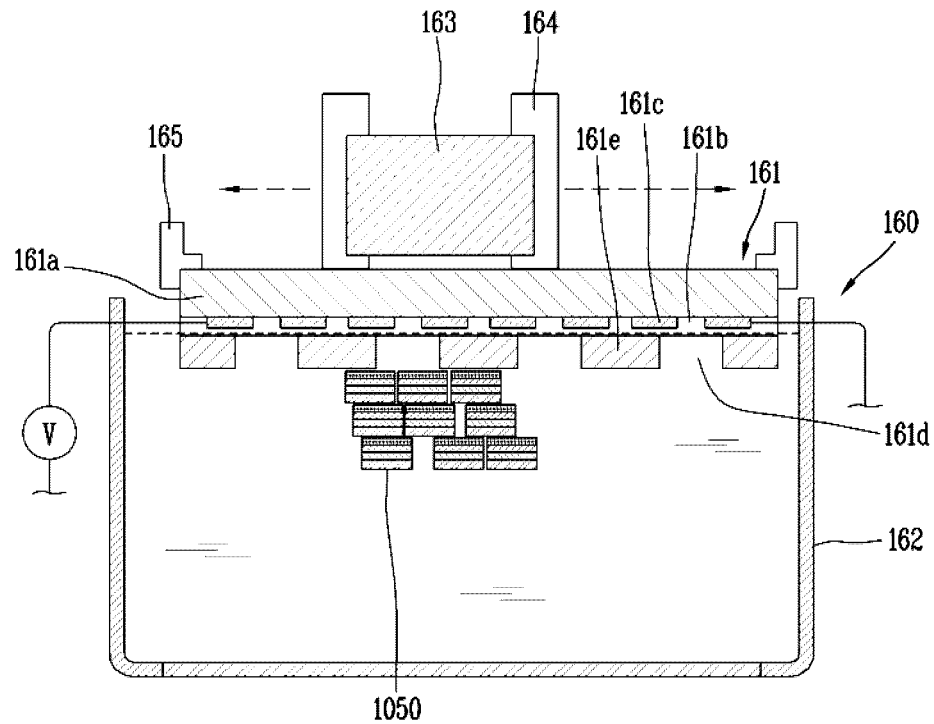
【Figure 8D】
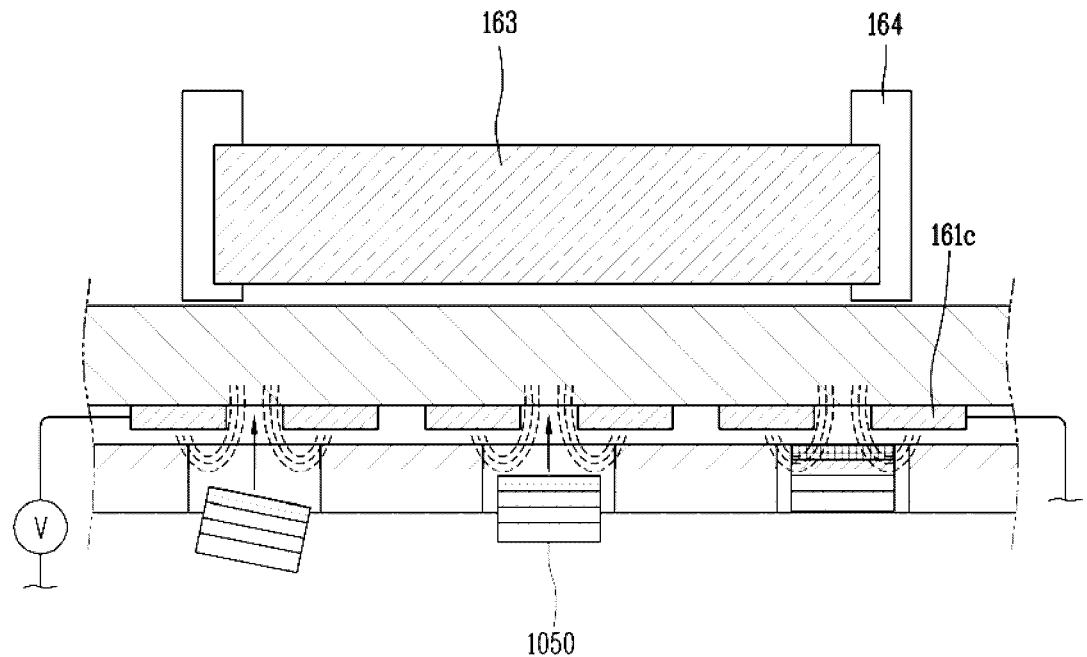

[Figure 8E]
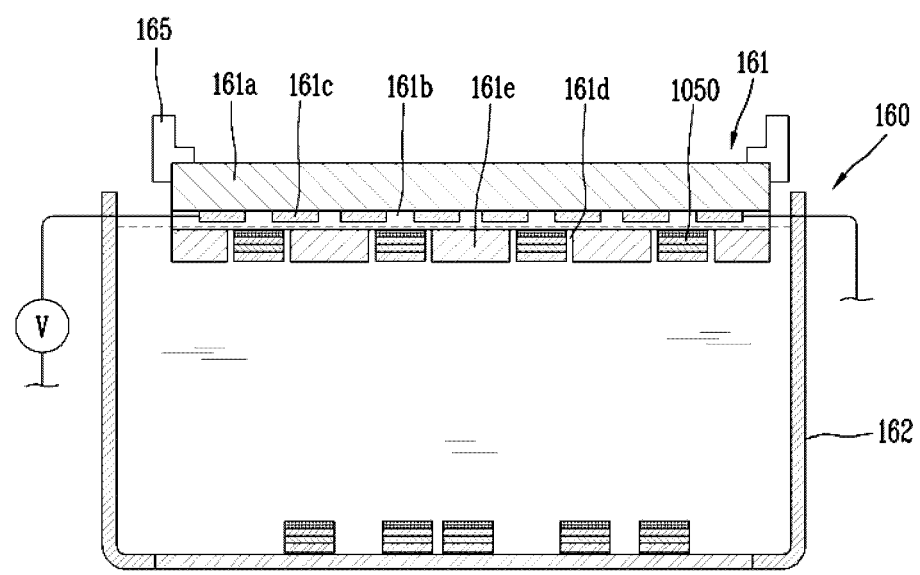

【Figure 9】
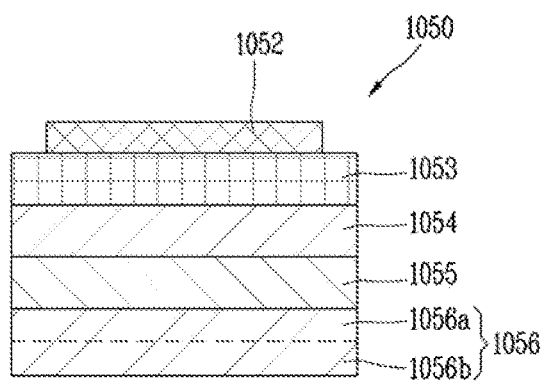
【Figure 10】
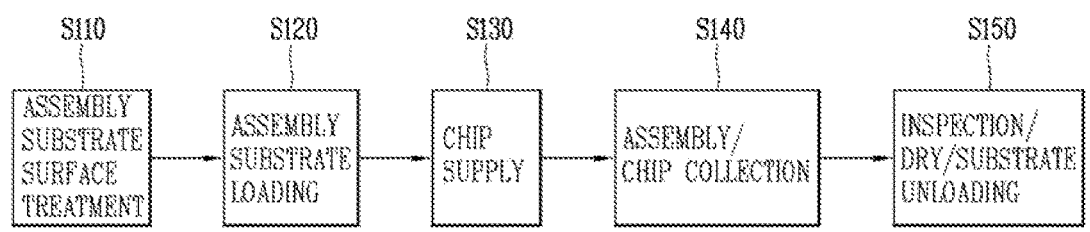

[Figure 11]
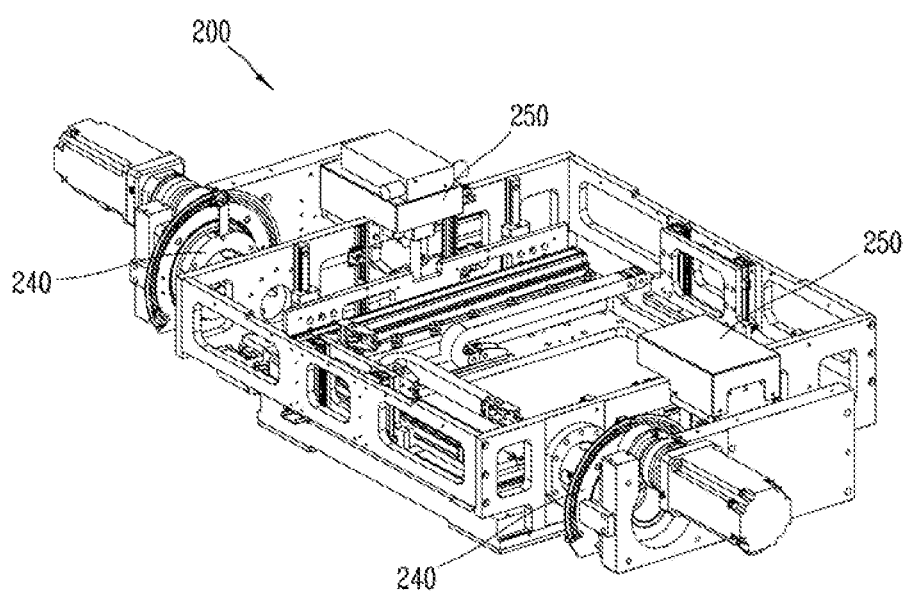

【Figure 12】
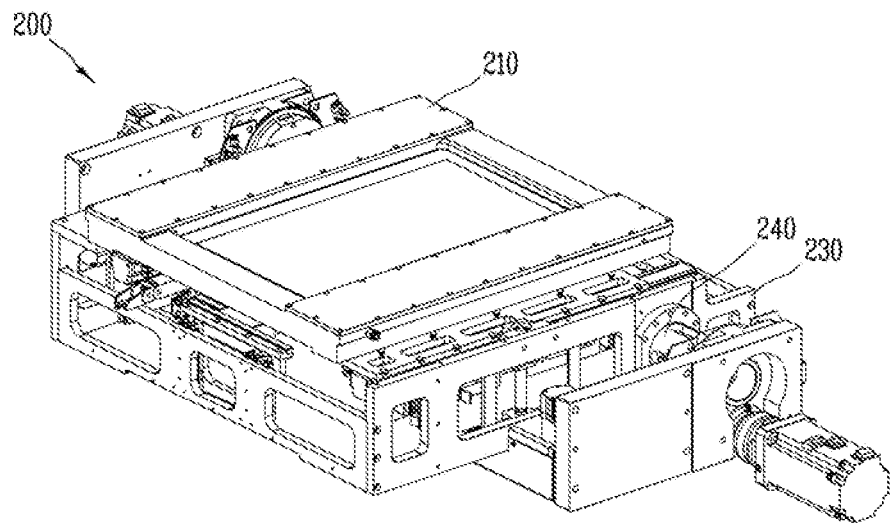
【Figure 13】
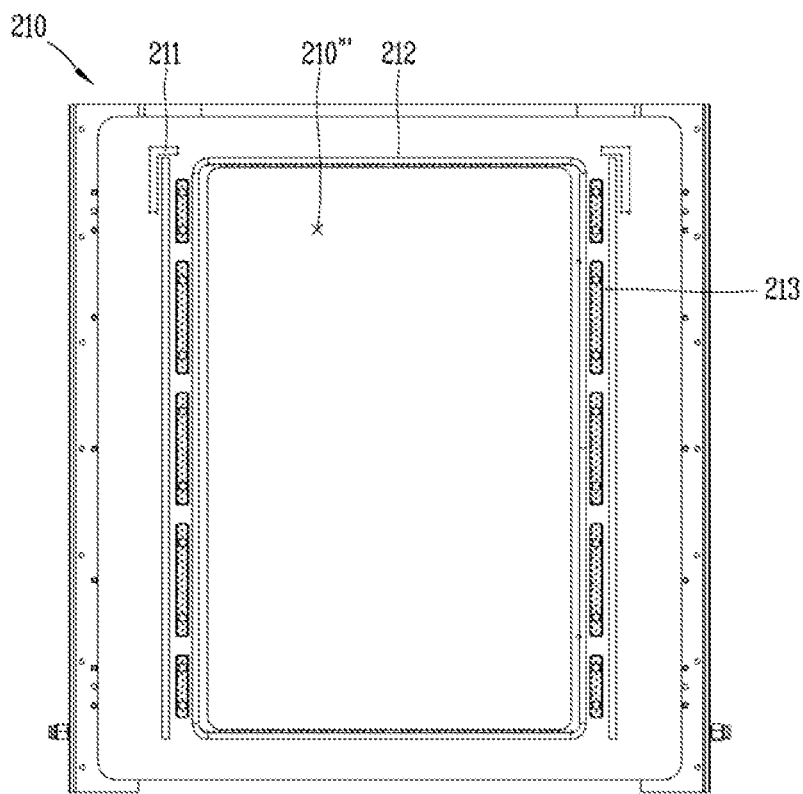

[Figure 14]
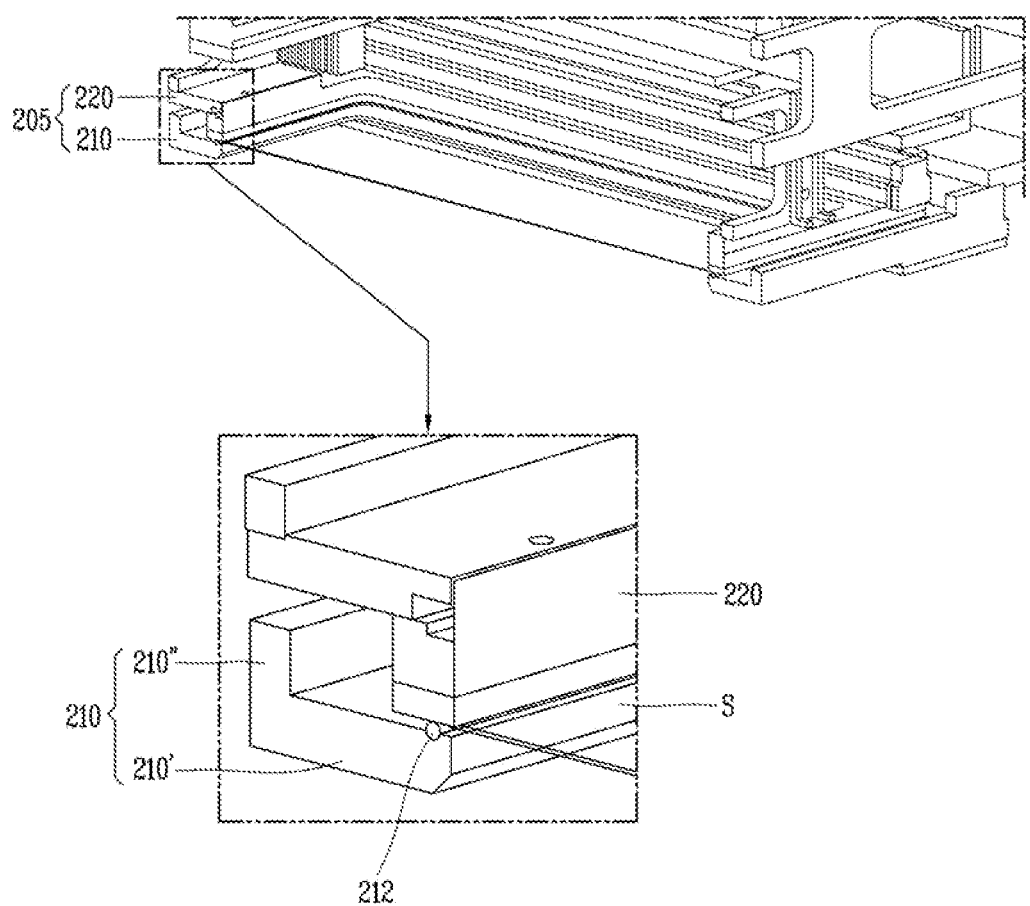

[Figure 15]
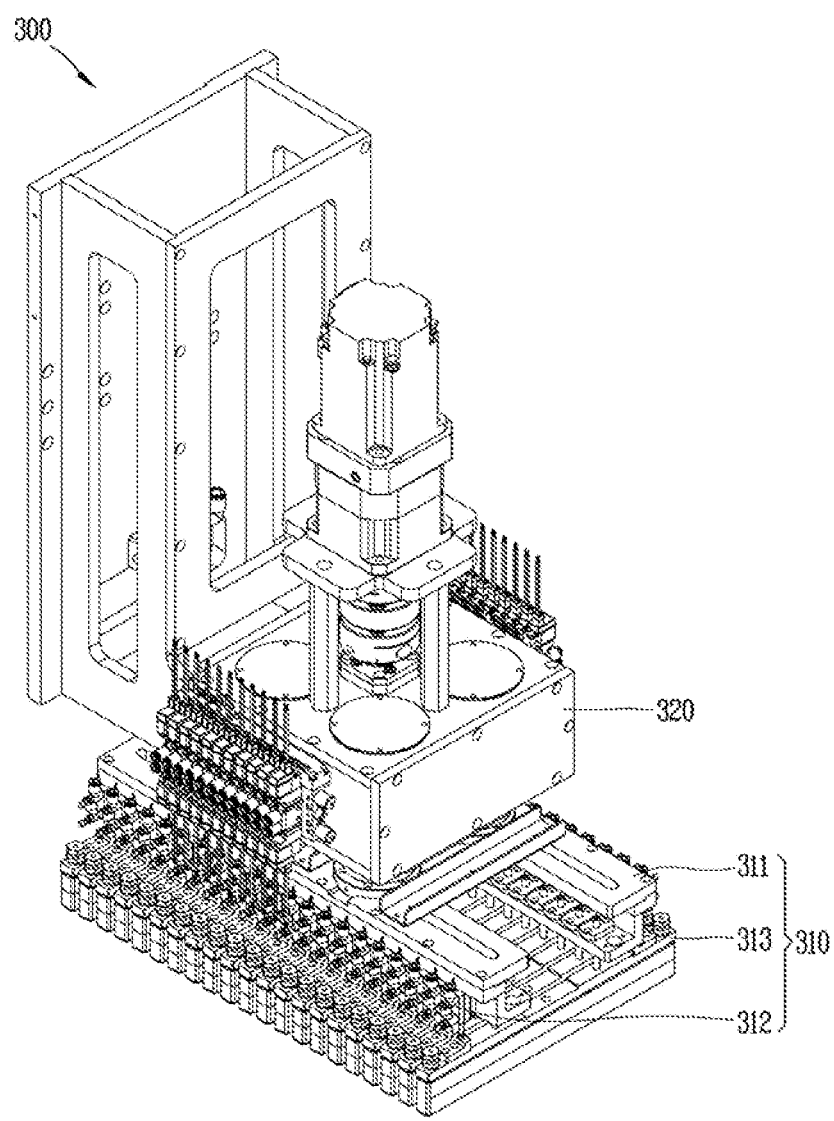

[Figure 16]
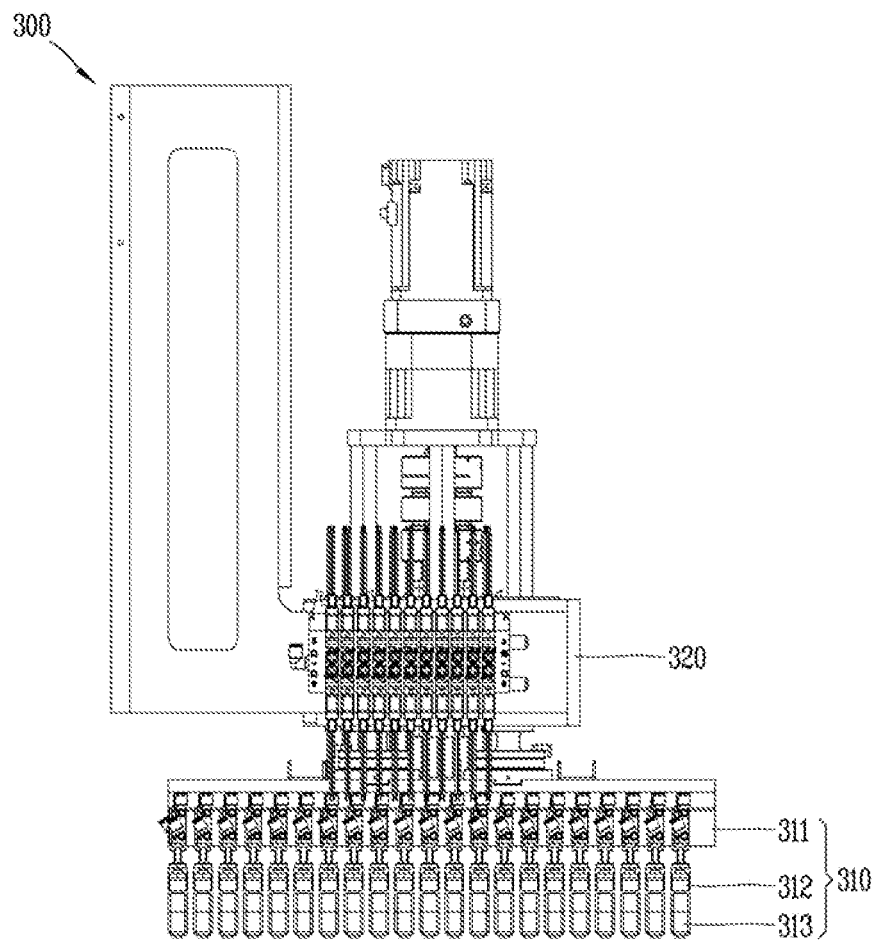

[Figure 17]
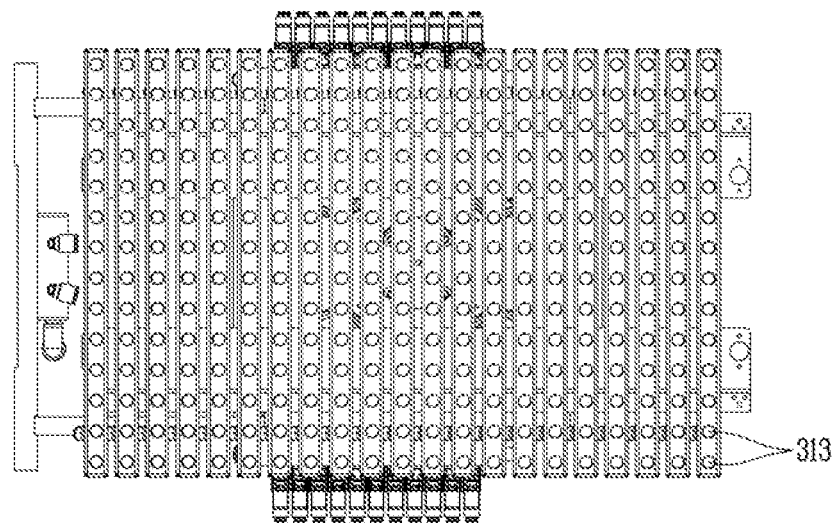
[Figure 18]
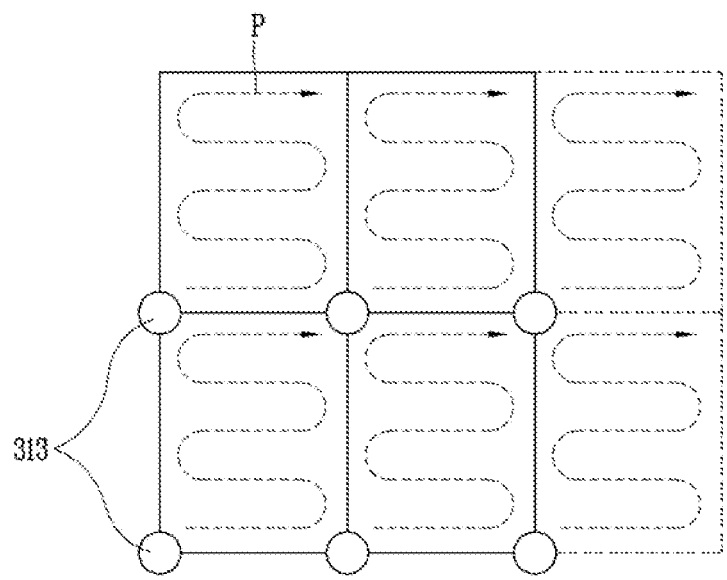

【Figure 19】
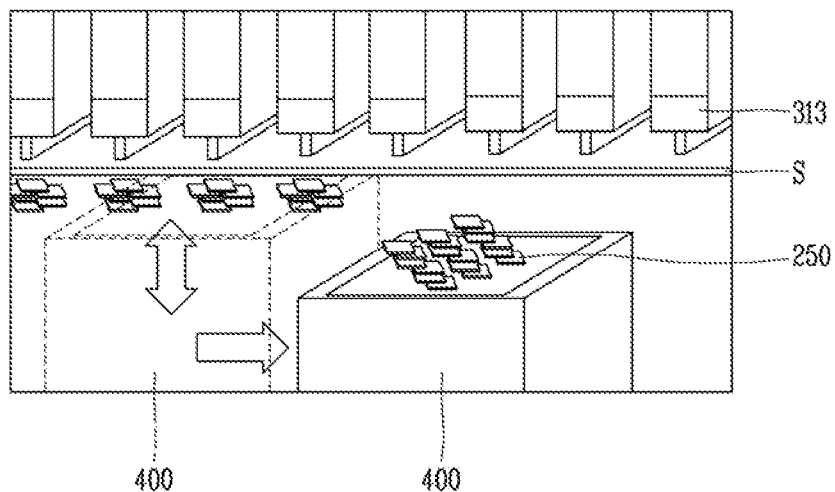
【Figure 20】
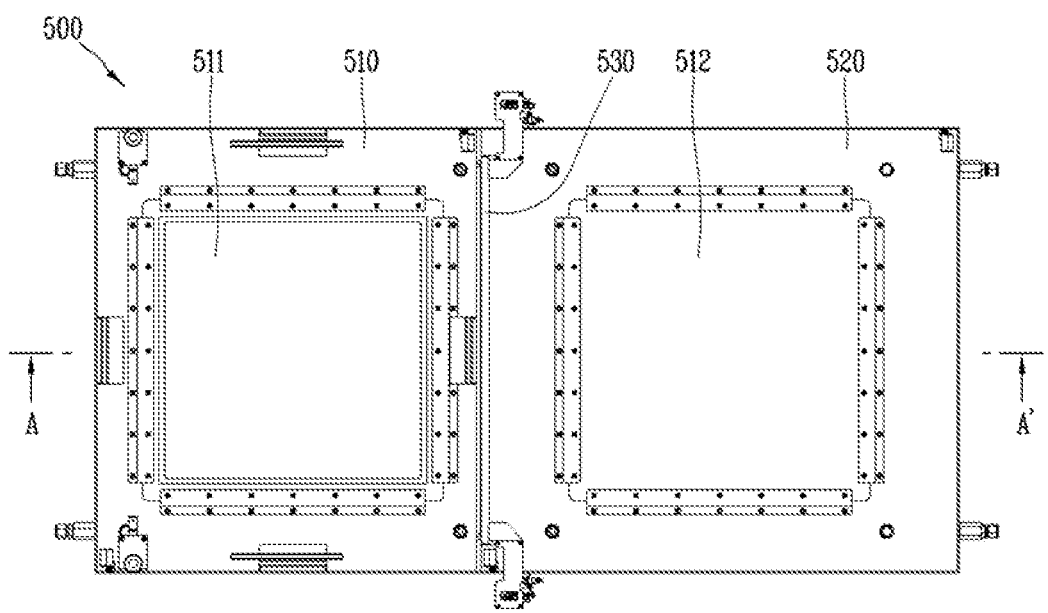

【Figure 21】
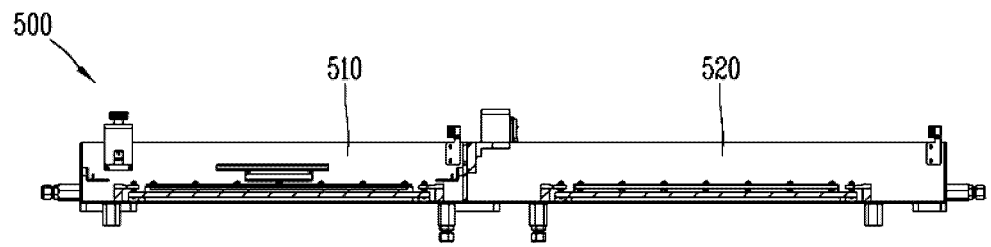
【Figure 22】
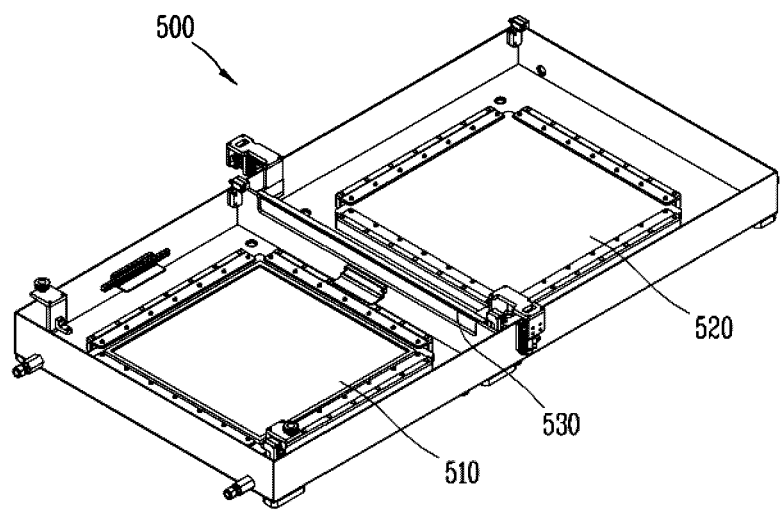
【Figure 23】
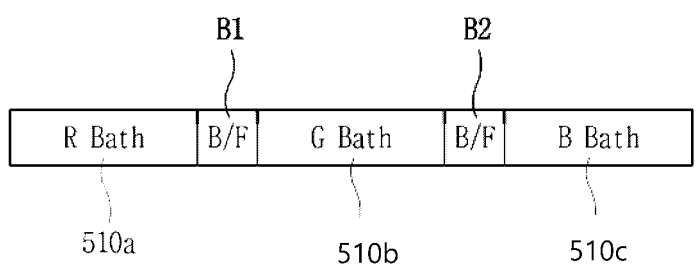

[Figure 24]
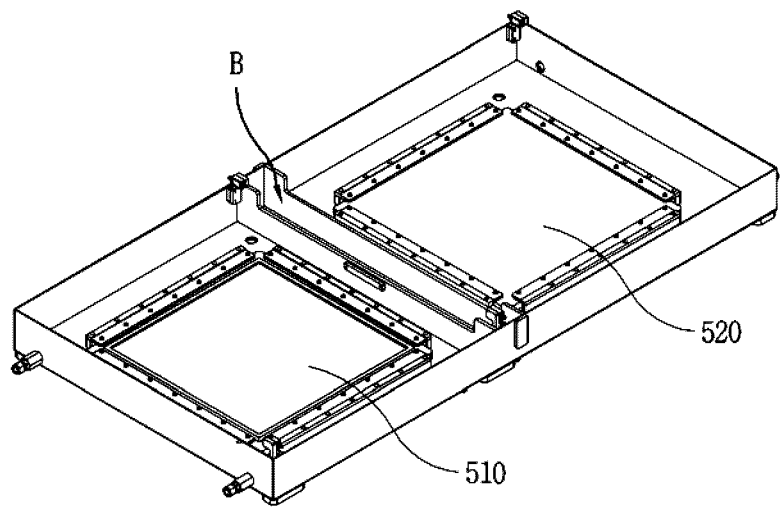
[Figure 25]
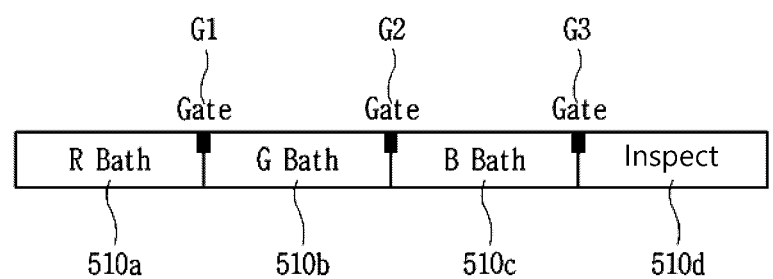

[Figure 26]
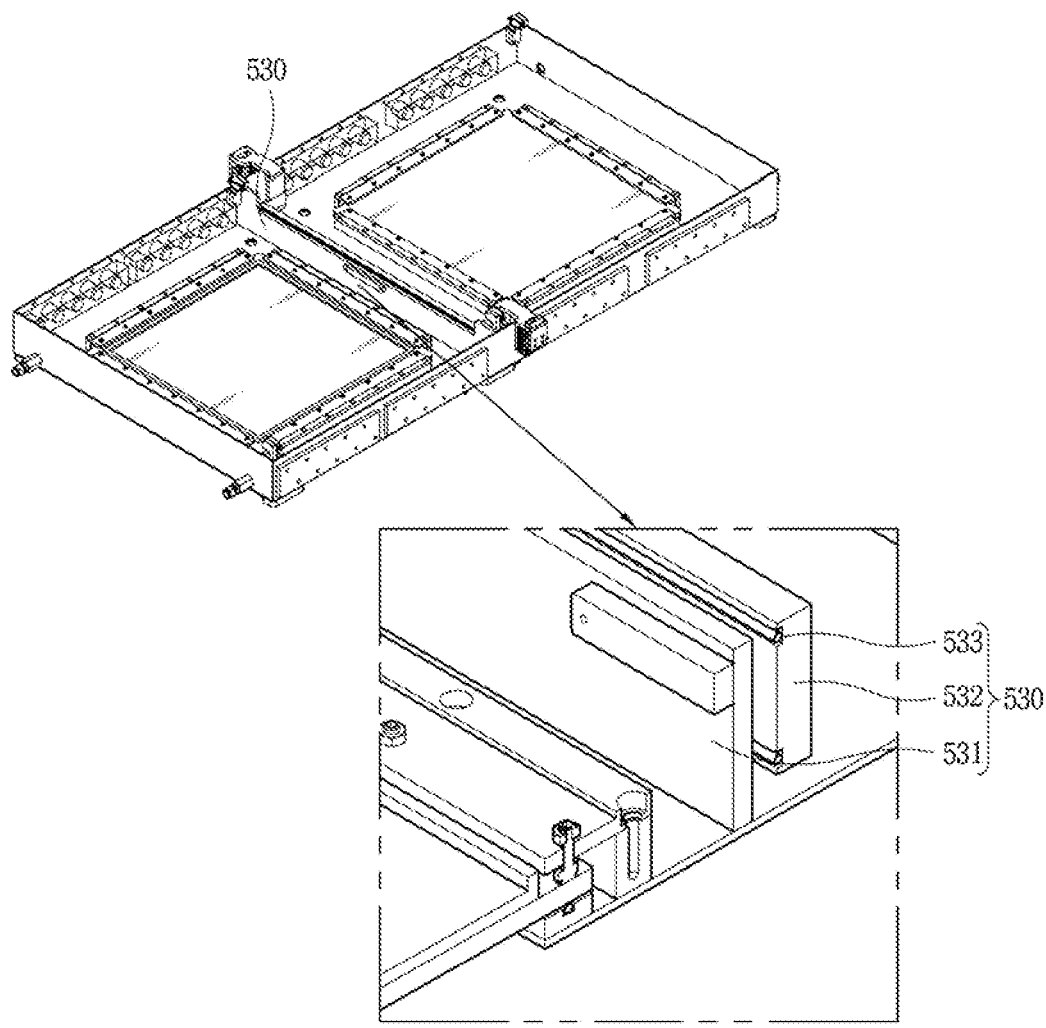

[Figure 27]
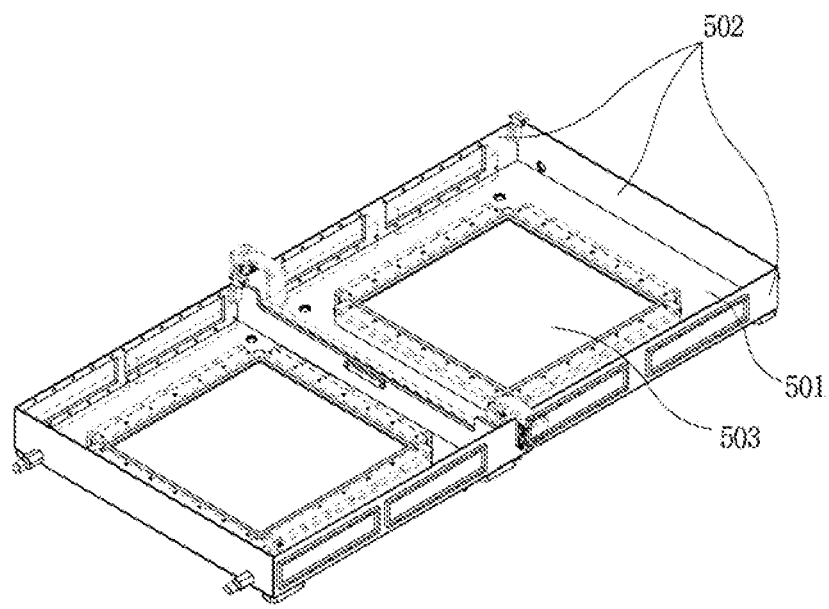
[Figure 28]
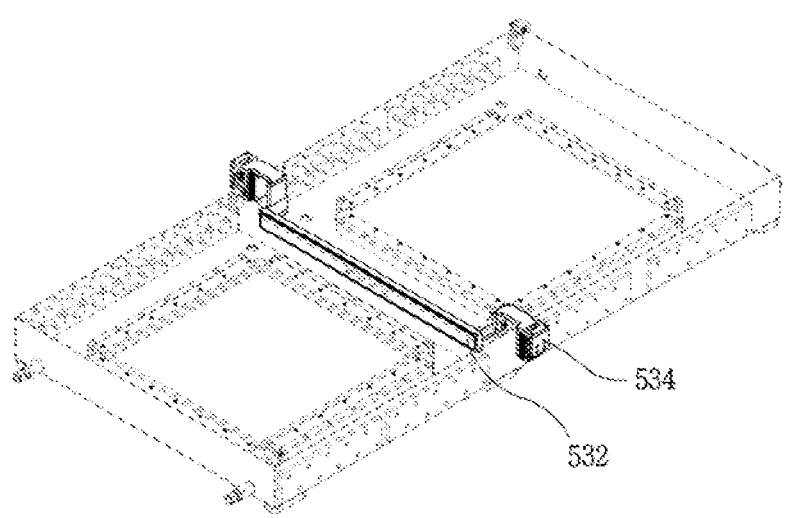

[Figure 29]
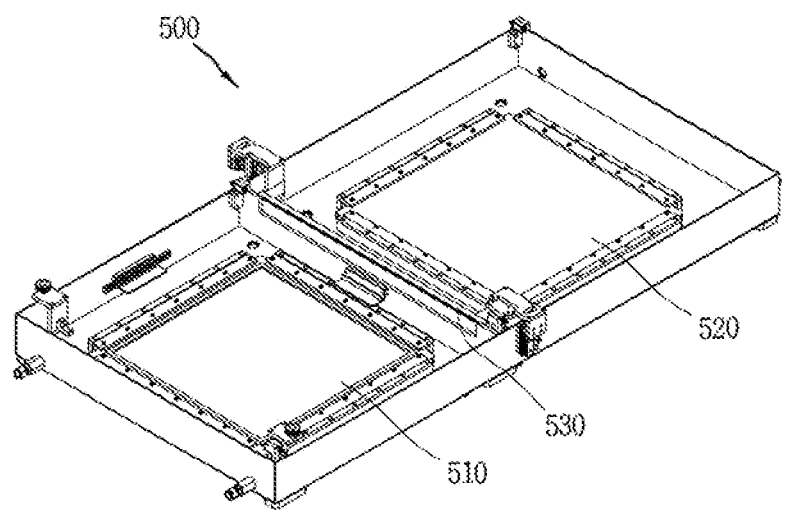
[Figure 30]
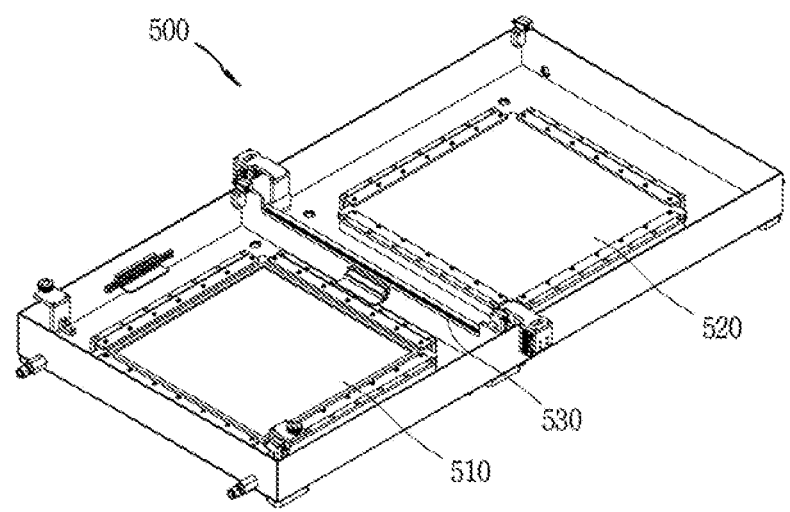

[Figure 31]
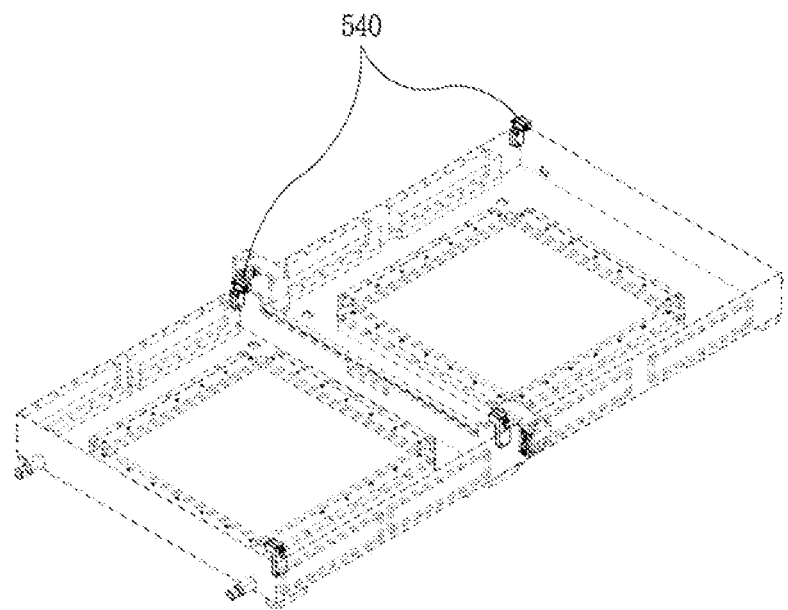
[Figure 32]
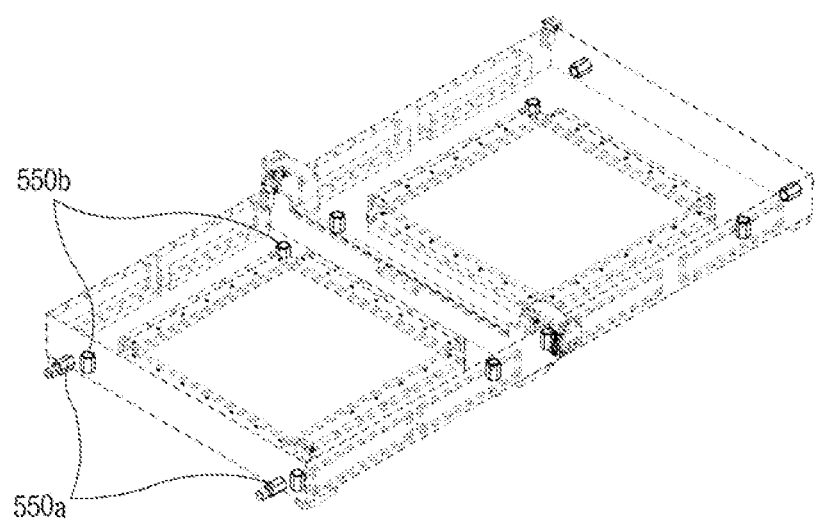

[Figure 33]
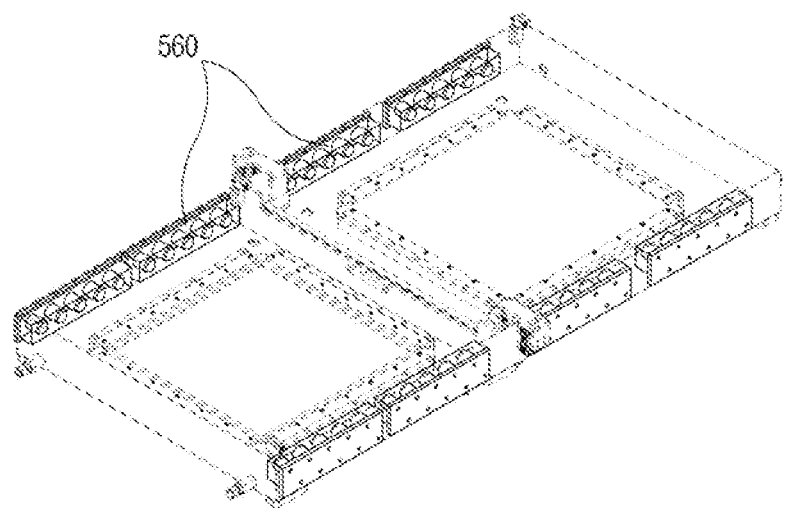

1

ASSEMBLY CHAMBER FOR SELF-ASSEMBLY OF SEMICONDUCTOR LIGHT-EMITTING DIODES

CROSS REFERENCE TO RELATED APPLICATIONS

This application is the National Stage filing under 35 U.S.C. 371 of International Application No. PCT/KR2020/002017, filed on Feb. 13, 2020, which claims the benefit of earlier filing date and right of priority to Korean Application Nos. 10-2019-0156076, filed on Nov. 28, 2019, and 10-2019-0115574, filed on Sep. 19, 2019, in the Republic of Korea, the entire contents of all these applications are hereby expressly incorporated by reference into the present application.

TECHNICAL FIELD

The present disclosure relates to a method for manufacturing a display device, and more particularly, an assembly chamber for self-assembling microLEDs.

BACKGROUND ART

In recent years, in the field of display technology, liquid-crystal displays (LCD), organic light-emitting diode (OLED) displays, microLED displays, etc. have been competing to realize large-area displays.

Meanwhile, semiconductor light-emitting diodes (microLEDs (μLED)) with a diameter or cross-sectional area less than 100 microns, when used in displays, can offer very high efficiency because the displays do not need a polarizer to absorb light. However, large-scale displays require several millions of semiconductor light-emitting diodes, which makes it difficult to transfer the devices compared to other technologies.

Some of the technologies currently in development for the transfer process include pick and place, laser lift-off (LLO), and self-assembly. Among these technologies, the self-assembly approach is a method that allows semiconductor light-emitting diodes to find their positions on their own in a fluid, which is most advantageous in realizing large-screen display devices.

Recently, U.S. Pat. No. 9,825,202 disclosed a microLED structure suitable for self-assembly, but there is not enough research being carried out on technologies for manufacturing displays by the self-assembly of microLEDs. In view of this, the present disclosure proposes anew manufacturing device for self-assembling microLEDs.

DISCLOSURE

Technical Problem

One aspect of the present disclosure is to provide a new manufacturing process that provides high reliability in large-screen displays using micro-size semiconductor light-emitting diodes.

Another object of the present invention is to provide an assembly chamber in which each region of the chamber can be freely moved while a substrate is immersed in a fluid.

Technical Solution

In order to achieve the above object, the present invention may provide an assembly chamber configured to contain a fluid. The assembling chamber may have a bottom portion, a side wall portion formed to a predetermined height on the bottom portion, and disposed on the bottom portion to surround the bottom portion, and a partition wall part formed to extend from one inner surface of a plurality of inner surfaces provided in the side wall portion to the other inner surface facing the one inner surface. And a vertical height of at least a portion of the partition wall portion may be variable with respect to the bottom portion.

In an embodiment, the partition wall part may include a frame part fixed to the bottom portion and a gate part configured to be movable along one surface of the frame part, and the height of at least a portion of the partition wall part may vary as the gate part moves.

In an embodiment, the gate part may switch from one of a first state positioned at a first height to the bottom portion and a second state positioned at a second height lower than the first height to another.

In an embodiment, the gate part may be in close contact with the frame part in the first state.

In an embodiment, the gate part may be switched to the second state after being spaced apart from the frame part by a predetermined distance in a state in which the gate part is in close contact with the frame part.

In an embodiment, a sealing part disposed on one surface of the gate part in close contact with the frame part may be further included.

In one embodiment, it may further include a water level sensor configured to sense the level of the contained fluid.

In one embodiment, it may include a fluid supply part disposed on at least one of the bottom portion and the side wall part configured to supply a fluid to the assembly chamber and it may include a fluid discharge part disposed on at least one of the bottom portion and the side wall portion configured to discharge the contained fluid to the outside.

In an embodiment, it may further include a sonicator disposed on at least one of the bottom portion and the side wall portion configured to vibrate the contained fluid at a predetermined frequency.

In an embodiment, at least a portion of the bottom portion may include a light-transmitting layer.

Advantageous Effects

With the above configuration according to the present disclosure, large numbers of semiconductor light-emitting diodes can be assembled at a time on a display device where individual pixels are made up of microLEDs.

As such, according to the present disclosure, large numbers of semiconductor light-emitting diodes can be pixelated on a small-sized wafer and then transferred onto a large-area substrate. This enables the manufacture of a large-area display device at a low cost.

Moreover, according to the present disclosure, a low-cost, high-efficiency, and quick transfer of semiconductor light-emitting diodes can be done, regardless of the sizes or numbers of parts and the transfer area, by transferring them in the right positions in a solution by using a magnetic field and an electric field.

Furthermore, the assembling of semiconductor light-emitting diodes by an electric field allows for selective assembling through selective electrical application without any additional equipment or processes. Also, since an assembly substrate is placed on top of a chamber, the substrate can be easily loaded or unloaded, and non-specific binding of semiconductor light-emitting diodes can be prevented.

In addition, according to the present invention, since the height of the partition wall part dividing the plurality of regions provided in the assembly chamber can be adjusted, it is possible to prevent the semiconductor light emitting devices floating in each region from mixing with each other, and each area of the substrate can be moved freely in the immersed state in the fluid.

DESCRIPTION OF DRAWINGS

FIG. 1 is a conceptual diagram showing one embodiment of a display device using semiconductor light-emitting diodes according to the present disclosure.

FIG. 2 is a partial enlarged view of the portion A in the display device of FIG. 1.

FIG. 3 is an enlarged view of the semiconductor light-emitting diodes of FIG. 2.

FIG. 4 is an enlarged view showing another embodiment of the semiconductor light-emitting diodes of FIG. 2.

FIGS. 5A to 5E are conceptual diagrams for explaining a new process for manufacturing the above-described semiconductor light-emitting diodes.

FIG. 6 is a conceptual diagram showing an example of a device for self-assembling semiconductor light-emitting diodes according to the present disclosure.

FIG. 7 is a block diagram of the self-assembly device of FIG. 6.

FIGS. 8A to 8E are conceptual diagrams showing a process for self-assembling semiconductor light-emitting diodes using the self-assembly device of FIG. 6.

FIG. 9 is a conceptual diagram for explaining the semiconductor light-emitting diodes of FIGS. 8A to 8E.

FIG. 10 is a flowchart showing a method for self-assembly according to the present disclosure.

FIG. 11 is a conceptual diagram showing a first state of a substrate chuck.

FIG. 12 is a conceptual diagram showing a second state of a substrate chuck.

FIG. 13 is a plan view of a first frame provided at a substrate chuck.

FIG. 14 is a conceptual diagram showing a state in which an assembly substrate is loaded at a substrate chuck.

FIG. 15 is a perspective view of a magnetic field forming part according to one embodiment of the present disclosure.

FIG. 16 is one side view of a magnetic field forming part according to one embodiment of the present disclosure.

FIG. 17 is a lower side view of a magnetic field forming part according to one embodiment of the present disclosure.

FIG. 18 is a conceptual diagram showing a trajectory of magnets provided at the magnetic field forming part according to the present disclosure.

FIG. 19 is a conceptual diagram showing a state in which a semiconductor light-emitting diode is supplied.

FIG. 20 is a plan view of an assembly chamber according to one embodiment of the present disclosure.

FIG. 21 is a cross-sectional view taken along line A-A' of FIG. 20.

FIG. 22 is a perspective view of an assembly chamber according to one embodiment of the present disclosure.

FIGS. 23 and 24 are conceptual views illustrating an assembly chamber having a buffer area.

FIG. 25 is a conceptual diagram illustrating an assembly chamber including a gate part.

FIG. 26 is an enlarged view of the gate part provided in the assembly chamber according to the present invention.

FIG. 27 is a conceptual view emphasizing the bottom portion and the side wall portion of the assembly chamber according to the present invention.

FIG. 28 is a conceptual diagram emphasizing the gate part according to the present invention.

FIGS. 29 and 30 are conceptual views illustrating a change in height of a partition wall part.

FIGS. 31 to 33 are conceptual views emphasizing the components provided in the assembly chamber according to the present invention.

MODE FOR INVENTION

Description will now be given in detail according to example embodiments disclosed herein, with reference to the accompanying drawings. For the sake of brief description with reference to the drawings, the same or equivalent components can be provided with the same or similar reference numbers, and description thereof will not be repeated. In general, a suffix such as "module" and "unit" can be used to refer to elements or components. Use of such a suffix herein is merely intended to facilitate description of the specification, and the suffix itself is not intended to give any special meaning or function. In the present disclosure, that which is well-known to one of ordinary skill in the relevant art has generally been omitted for the sake of brevity. The accompanying drawings are used to help easily understand various technical features and it should be understood that the embodiments presented herein are not limited by the accompanying drawings.

Also, it will be understood that when an element, such as a layer, area or substrate is referred to as being "disposed on" another element, the element can be disposed directly on another element or there are no intervening elements present.

Mobile terminals described herein can include cellular phones, smart phones, laptop computers, digital broadcasting terminals, personal digital assistants (PDAs), portable multimedia players (PMPs), navigators, slate PCs, tablet PC, ultra-books, digital TVs, digital signage, head-mounted displays (HMDs), desk top computers and the like. However, it can be easily understood by those skilled in the art that the configuration according to the example embodiments of this specification can also be applied to any device capable of displaying information even though such device is a new type of product to be developed.

FIG. 1 is a conceptual diagram showing one embodiment of a display device using semiconductor light-emitting diodes according to the present disclosure. FIG. 2 is a partial enlarged view of the portion A in the display device of FIG. 1. FIG. 3 is an enlarged view of the semiconductor light-emitting diodes of FIG. 2. FIG. 4 is an enlarged view showing another embodiment of the semiconductor light-emitting diodes of FIG. 2.

According to the illustration, information processed by a controller of a display device 100 can be outputted by a display module 140. A closed loop-shaped case 101 that runs around the edge of the display module can form the bezel of the display device.

The display module 140 comes with a panel 141 that displays an image, and the panel 141 can come with micro-sized semiconductor light-emitting diodes 150 and a wiring substrate 110 where the semiconductor light-emitting diodes 150 are mounted.

The wiring substrate 110 can be formed with wiring lines, which can be connected to n-type electrodes 152 and p-type electrodes 156 of the semiconductor light-emitting diodes 150. As such, the semiconductor light-emitting diodes 150 can be provided on the wiring substrate 110 as individual pixels that emit light on their own.

The image displayed on the panel 141 is visual information, which is rendered by controlling the light emission of unit pixels (sub-pixels) arranged in a matrix independently through the wiring lines.

The present disclosure takes microLEDs (light-emitting diodes) as an example of the semiconductor light-emitting diodes 150 which convert current into light. The microLEDs can be light-emitting diodes that are small in size—less than 100 microns. The semiconductor light-emitting diodes 150 have light-emitting regions of red, green, and blue, and unit pixels can produce light through combinations of these colors. That is, the unit pixels are the smallest units for producing one color. Each unit pixels can contain at least three microLEDs.

More specifically, referring to FIG. 3, the semiconductor light-emitting diodes 150 can have a vertical structure.

For example, the semiconductor light-emitting diodes 150 can be implemented as high-power light-emitting diodes that are composed mostly of gallium nitride (GaN), with some indium (In) and/or aluminum (Al) added to it, and emit light of various colors.

Such a vertical semiconductor light-emitting diode comprises a p-type electrode 156, a p-type semiconductor layer 155 formed on the p-type electrode 156, an active layer 154 formed on the p-type semiconductor layer 155, an n-type semiconductor layer 153 formed on the active layer 154, and an n-type electrode 152 formed on the n-type semiconductor layer 153. In this case, the p-type electrode 156 at the bottom can be electrically connected to a p electrode of the wiring substrate, and the n-type electrode 152 at the top can be electrically connected to an n electrode above the semiconductor light-emitting diode. One of the biggest advantages of the vertical semiconductor light-emitting diode 150 is that the chip size can be reduced by vertically aligning electrodes.

In another example, referring to FIG. 4, the semiconductor light-emitting diodes can be flip chip-type light-emitting diodes.

As an example of such a flip chip-type light-emitting diode, the semiconductor light-emitting diode 150' comprises a p-type electrode 156', a p-type semiconductor layer 155' formed on the p-type electrode 156', an active layer 154' formed on the p-type semiconductor layer 155', an n-type semiconductor layer 153' formed on the active layer 154', and an n-type electrode 152' vertically separated from the p-type electrode 156', on the n-type semiconductor layer 153'. In this case, both the p-type electrode 156' and the n-type electrode 152' can be electrically connected to a p electrode and an n electrode of the wiring substrate, below the semiconductor light-emitting diode.

The vertical semiconductor light-emitting diode and a horizontal light-emitting diode each can be used as a green semiconductor light-emitting diode, blue semiconductor light-emitting diode, or red semiconductor light-emitting diode. The green semiconductor light-emitting diode and the blue semiconductor light-emitting diode can be implemented as high-power light-emitting diodes that are composed mostly of gallium nitride (GaN), with some indium (In) and/or aluminum (Al) added to it, and emit green and blue light, respectively. As an example of such high-power light-emitting diodes, the semiconductor light-emitting diodes can be composed of gallium nitride thin films which are formed of various layers of n-Gan, p-GaN, AlGaN, InGaN, etc. More specifically, the p-type semiconductor layer can be P-type GaN, and the n-type semiconductor layer can be N-type GaN.

Moreover, the p-type semiconductor layer can be P-type GaN doped with Mg on the p electrode, and the n-type semiconductor layer can be N-type GaN doped with Si on the n electrode. In this case, the above-described semiconductor light-emitting diodes can come without the active layer.

Meanwhile, referring to FIGS. 1 to 4, because of the very small size of the light-emitting diodes, self-emissive, high-definition unit pixels can be arranged on the display panel, and therefore the display device can deliver high picture quality.

In the above-described display device using semiconductor light-emitting diodes according to the present disclosure, semiconductor light-emitting diodes are grown on a wafer, formed through mesa and isolation, and used as individual pixels. In this case, the micro-sized semiconductor light-emitting diodes 150 should be transferred onto a wafer, at preset positions on a substrate of the display panel. One of the transfer technologies available is pick and place, but it has a low success rate and requires a lot of time. In another example, a number of diodes can be transferred at a time by using a stamp or roll, which, however, is not suitable for large-screen displays because of limited yields. The present disclosure suggests a new method and device for manufacturing a display device that can improve on these problems.

To this end, the new method for manufacturing a display device will be described first below. FIGS. 5A to 5E are conceptual diagrams for explaining a new process for manufacturing the above-described semiconductor light-emitting diodes.

In this specification, a display device using passive matrix (PM) semiconductor light-emitting diodes will be illustrated. It should be noted that the illustration given below also applies to active matrix (AM) semiconductor light-emitting diodes or other electrical devices. Also, although the illustration will be given of how horizontal semiconductor light-emitting diodes are self-assembled, it also can apply to self-assembling of vertical semiconductor light-emitting diodes and other electrical devices.

First of all, according to the manufacturing method, a first conductive semiconductor layer 153, an active layer 154, and a second conductive semiconductor layer 155 are grown on a growth substrate 159 (FIG. 5A).

Once the first conductive semiconductor layer 153 is grown, then the active layer 154 is grown on the first conductive semiconductor layer 153, and then the second conductive semiconductor layer 155 is grown on the active layer 154. By sequentially growing the first conductive semiconductor layer 153, active layer 154, and second conductive semiconductor layer 155, the first conductive semiconductor layer 153, active layer 154, and second conductive semiconductor layer 155 form a stack structure as shown in FIG. 5A.

In this case, the first conductive semiconductor layer 153 can be a p-type semiconductor layer, and the second conductive semiconductor layer 155 can be an n-type semiconductor layer. However, the present disclosure is not necessarily limited to this, and the first conductive type can be n-type and the second conductive type can be p-type.

Moreover, although this example embodiment is illustrated by assuming the presence of the active layer, the active layer can be omitted if necessary or desired, as stated above. In an example, the p-type semiconductor layer can be P-type GaN doped with Mg, and the n-type semiconductor layer can be N-type GaN doped with Si on the n electrode.

The growth substrate 159 (e.g., a wafer) can be formed of, but not limited to, light-transmissive material—for example, at least one among sapphire ($Al_2O_3$), GaN, ZnO, and AlO. Also, the growth substrate 159 can be made from a material suitable for growing semiconductor materials or carrier wafer. The growth substrate 159 can be formed of high thermal conducting material, and can be a conductive substrate or insulating substrate—for example, at least one among SiC, Si, GaAs, GaP, InP, and $Ga_2O_3$ substrates which have higher thermal conductivity than sapphire ($Al_2O_3$) substrates.

Next, a plurality of semiconductor light-emitting diodes are formed by removing at least part of the first conductive semiconductor layer 153, active layer 154, and second conductive semiconductor layer 155 (see FIG. 5B).

More specifically, isolation is performed so that the light-emitting diodes form a light-emitting diode array. That is, a plurality of semiconductor light-emitting diodes are formed by vertically etching the first conductive semiconductor layer 153, active layer 154, and second conductive semiconductor layer 155, for example.

In the case of horizontal semiconductor light-emitting diodes, a mesa process can be performed which exposes the first conductive semiconductor layer 153 to the outside by vertically removing part of the active layer 154 and second conductive layer 155, and then isolation can be performed which forms an array of semiconductor light-emitting diodes by etching the first conductive semiconductor layer 153.

Next, a second conductive electrode 156 (or p-type electrode) is formed on one surface of the second conductive semiconductor layer 155 (see FIG. 5C). The second conductive electrode 156 can be formed by a deposition method such as sputtering, but the present disclosure is not necessarily limited to this. In a case where the first conductive semiconductor layer and the second conductive semiconductor layer are an n-type semiconductor layer and a p-type semiconductor layer, respectively, the second conductive electrode 156 can serve as an n-type electrode.

Next, the growth substrate 159 is removed, thus leaving a plurality of semiconductor light-emitting diodes. For example, the growth substrate 159 can be removed using laser lift-off (LLO) or chemical lift-off (CLO) (see FIG. 5D).

Afterwards, the step of mounting the semiconductor light-emitting didoes 150 on a substrate in a chamber filled with a fluid is performed (see FIG. 5E).

For example, the semiconductor light-emitting diodes 150 and the substrate are put into the chamber filled with a fluid, and the semiconductor light-emitting diodes are self-assembled onto the substrate 161 using fluidity, gravity, surface tension, etc. In this case, the substrate can be an assembly substrate 161.

In another example, a wiring substrate, instead of the assembly substrate 161, can be put into an assembly chamber, and the semiconductor light-emitting diodes 150 can be mounted directly onto the wiring substrate. In this case, the substrate can be a wiring substrate. For convenience of explanation, the present disclosure is illustrated with an example in which the semiconductor light-emitting diodes 150 are mounted onto the assembly substrate 161.

To facilitate the mounting of the semiconductor light-emitting diodes 150 onto the assembly substrate 161, cells into which the semiconductor light-emitting diodes 150 are fitted can be provided on the assembly substrate 161. Specifically, cells where the semiconductor light-emitting diodes 150 are mounted are formed on the assembly substrate 161, at positions where the semiconductor light-emitting diodes 150 are aligned with wiring electrodes. The semiconductor light-emitting diodes 150 are assembled to the cells as they move within the fluid.

After arraying the semiconductor light-emitting didoes on the assembly substrate 161, the semiconductor light-emitting diodes can be transferred to the wiring substrate from the assembly substrate 161, thereby enabling a large-area transfer across a large area. Thus, the assembly substrate 161 can be referred to as a temporary substrate.

Meanwhile, the above-described self-assembly method requires a higher transfer yield so that it can be applied to the manufacture of large-screen displays. The present disclosure proposes a method and device that minimizes the effects of gravity or friction and avoids non-specific binding, in order to increase the transfer yield.

In this case, in the display device according to the present disclosure, a magnetic material is placed on the semiconductor light-emitting diodes so that the semiconductor light-emitting diodes are moved by magnetic force, and the semiconductor light-emitting diodes are mounted at preset positions by an electric field while in the process of being moved. This transfer method and device will be described in more details below with reference to the accompanying drawings.

FIG. 6 is a conceptual diagram showing an example of a device for self-assembling semiconductor light-emitting diodes according to the present disclosure. FIG. 7 is a block diagram of the self-assembly device of FIG. 6. FIGS. 8A to 8E are conceptual diagrams showing a process for self-assembling semiconductor light-emitting diodes using the self-assembly device of FIG. 6. FIG. 9 is a conceptual diagram for explaining the semiconductor light-emitting diodes of FIGS. 8A to 8E.

Referring to FIGS. 6 and 7, the self-assembly device 160 of the present disclosure can comprise an assembly chamber 162, magnets 163, and a position controller 164.

The assembly chamber 162 is equipped with space for a plurality of semiconductor light-emitting diodes. The space can be filled with a fluid, and the fluid can be an assembly solution, which includes water or the like. Thus, the assembly chamber 162 can be a water tank and configured as open-type. However, the present disclosure is not limited to this, and the assembly chamber 162 can be a closed-type chamber that comes with a closed space.

A substrate 161 can be placed in the assembly chamber 162 so that an assembly surface where the semiconductor light-emitting diodes 150 are assembled facing downwards. For example, the substrate 161 is fed to an assembly site by a feed unit, and the feed unit can come with a stage 165 where the substrate is mounted. The position of the stage 165 can be adjusted by the controller, whereby the substrate 161 can be fed to the assembly site.

In this instance, the assembly surface of the substrate 161 at the assembly site faces the bottom of the assembly chamber 162. As shown in the drawings, the assembly surface of the substrate 161 is placed in such a way as to be soaked with the fluid in the assembly chamber 162. Thus, the semiconductor light-emitting diodes 150 in the fluid are moved to the assembly surface.

The substrate 161 is an assembly substrate where an electric field can be formed, and can comprise a base portion 161a, a dielectric layer 161b, and a plurality of electrodes 161c.

The base portion 161a is made of insulating material, and the electrodes 161c can be thin-film or thick-film bi-planar electrodes that are patterned on one surface of the base portion 161a. The electrodes 161c can be formed of a stack of Ti/Cu/Ti, Ag paste, ITO, etc.

The dielectric layer 161b can be made of inorganic material such as $SiO_2$, SiNx, SiON, $Al_2O_3$, $TiO_2$, $HfO_2$, etc. Alternatively, the dielectric layer 161b can be an organic insulator and composed of a single layer or multi-layers. The thickness of the dielectric layer 161b can range from several tens of nm to several μm.

Further, the substrate 161 according to the present disclosure comprises a plurality of cells 161d that are separated by partition walls 161e. The cells 161d can be sequentially arranged in one direction and made of polymer material. Also, the partition walls 161e forming the cells 161d can be shared with neighboring cells 161d. The partition walls 161e can protrude from the base portion 161a, and the cells 161d can be sequentially arranged in one direction along the partition walls 161e. More specifically, the cells 161d can be sequentially arranged in column and row directions and have a matrix structure.

As shown in the drawings, the cells 161d can have recesses for accommodating the semiconductor light-emitting diodes 150, and the recesses can be spaces defined by the partition walls 161e. The recesses can have a shape identical or similar to the shape of the semiconductor light-emitting diodes. For example, if the semiconductor light-emitting diodes are rectangular, the recesses can be rectangular too. Moreover, the recesses formed in the cells can be circular if the semiconductor light-emitting diodes are circular. Further, each cell is configured to accommodate one semiconductor light-emitting diode. That is, one cell accommodates one semiconductor light-emitting diode.

Meanwhile, the plurality of electrodes 161c have a plurality of electrode lines that are placed at the bottom of the cells 161d, and the electrode lines can be configured to extend to neighboring cells.

The electrodes 161c are placed on the undersides of the cells 161d, and different polarities can be applied to create an electric field within the cells 161d. To form an electric field, the dielectric layer 161b can form the bottom of the cells 161d while covering the electrodes 161c. With this structure, when different polarities are applied to a pair of electrodes 161c on the underside of each cell 161d, an electric field is formed and the semiconductor light-emitting diodes can be inserted into the cells 161d by the electric field.

The electrodes of the substrate 161 at the assembly site are electrically connected to a power supply 171. The power supply 171 performs the function of generating an electric field by applying power to the electrodes.

As shown in the drawings, the self-assembly device can have magnets 163 for applying magnetic force to the semiconductor light-emitting diodes. The magnets 163 are placed at a distance from the assembly chamber 162 and apply a magnetic force to the semiconductor light-emitting diodes 150. The magnets 163 can be placed to face the opposite side of the assembly surface of the substrate 161, and the positions of the magnets 163 are controlled by the position controller 164 connected to the magnets 163.

The semiconductor light-emitting diodes 1050 can have a magnetic material so that they are moved within the fluid by a magnetic field.

Referring to FIG. 9, a semiconductor light-emitting diode having a magnetic material can comprise a first conductive electrode 1052, a second conductive electrode 1056, a first conductive semiconductor layer 1053 where the first conductive electrode 1052 is placed, a second conductive semiconductor layer 1055 which overlaps the first conductive semiconductor layer 1053 and where the second conductive semiconductor layer 1055 is placed, and an active layer 1054 placed between the first and second conductive semiconductor layers 1053 and 1055.

Here, the first conductive type can refer to p-type, and the second conductive type can refer to n-type, or vice versa. As stated previously, the semiconductor light-emitting diode can be formed without the active layer.

Meanwhile, in the present disclosure, the first conductive electrode 1052 can be formed after the semiconductor light-emitting diode is assembled onto the wiring substrate by the self-assembling of the semiconductor light-emitting diode. Further, in the present disclosure, the second conductive electrode 1056 can comprise a magnetic material. The magnetic material can refer a magnetic metal. The magnetic material can be Ni, SmCo, etc. In another example, the magnetic material can include at least one among Gd-based, La-based, and Mn-based materials.

The magnetic material can be provided in the form of particles on the second conductive electrode 1056. Alternatively, one layer of a conductive electrode comprising a magnetic material can be composed of the magnetic material. An example of this is the second conductive electrode 1056 of the semiconductor light-emitting diode 1050 which comprises a first layer 1056a and a second layer 1056b, as shown in FIG. 9. Here, the first layer 1056a can comprise a magnetic material, and the second layer 1056b can comprise a metal material other than the magnetic material.

As shown in the drawing, in this example, the first layer 1056a comprising the magnetic material can be placed in contact with the second conductive semiconductor layer 1055. In this case, the first layer 1056a is placed between the second layer 1056b and the second conductive semiconductor layer 1055. The second layer 1056b can be a contact metal that is connected to the wiring electrode on the wiring substrate. However, the present disclosure is not necessarily limited to this, and the magnetic material can be placed on one surface of the first conductive semiconductor layer.

Referring again to FIGS. 6 and 7, more specifically, on top of the assembly chamber of the self-assembly device, a magnet handler (or magnetic handler) capable of automatically or manually moving the magnets 163 on the x, y, and z axes or a motor capable of rotating the magnets 163 can be provided. The magnet handler and motor can constitute the position controller 164. As such, the magnets 163 can rotate in a horizontal, clockwise, or counterclockwise direction to the substrate 161.

Meanwhile, the assembly chamber 162 can be formed with a light-transmissive bottom plate 166, and the semiconductor light-emitting diodes can be placed between the bottom plate 166 and the substrate 161. An image sensor 167 can be placed opposite to the bottom plate 166 so as to monitor the inside of the assembly chamber 162 through the bottom plate 166. The image sensor 167 can be controlled by a controller 172, and can come with an inverted-type lens, CCD, etc. so as to observe the assembly surface of the substrate 161.

The above-described self-assembly device is configured to use a magnetic field and an electric field in combination. With this, the semiconductor light-emitting diodes are mounted at preset positions on the substrate by an electric field while in the process of being moved by changes in the positions of the magnets. Below, the assembly process using the above-described self-assembly device will be described in more details.

First of all, a plurality of semiconductor light-emitting diodes 1050 having a magnetic material can be formed through the process explained with reference to FIGS. 5A to 5C. In this case, the magnetic material can be deposited onto the semiconductor light-emitting didoes in the process of forming the second conductive electrode of FIG. 5C.

Next, the substrate 161 is fed to an assembly site, and the semiconductor light-emitting diodes 1050 are put into the assembly chamber 162 (see FIG. 8A).

As described above, the assembly site on the substrate 161 can be a position at which the substrate 161 is placed in the assembly chamber 162 in such a way that an assembly surface where the semiconductor light-emitting diodes 150 are assembled faces downwards.

In this case, some of the semiconductor light-emitting diodes 1050 can sink to the bottom of the assembly chamber 162 and some of them can float in the fluid. If the assembly chamber 162 comes with a light-transmissive bottom plate 166, some of the semiconductor light-emitting diodes 1050 can sink to the bottom plate 166.

Next, a magnetic force is applied to the semiconductor light-emitting diodes 1050 so that the semiconductor light-emitting diodes 1050 in the assembly chamber 162 come up to the surface (see FIG. 8B).

When the magnets 163 of the self-assembly device move to the opposite side of the assembly surface of the substrate 161 from their original positions, the semiconductor light-emitting diodes 1050 float in the fluid towards the substrate 161. The original positions can refer to positions at which the magnets 163 are outside the assembly chamber 162. In another example, the magnets 163 can be composed of electromagnets. In this case, an initial magnetic force is generated by supplying electricity to the electromagnets.

Meanwhile, in this embodiment, the assembly surface of the substrate 161 and the spacing between the semiconductor light-emitting diodes 1050 can be controlled by adjusting the strength of the magnetic force. For example, the spacing is controlled by using the weight, buoyancy, and magnetic force of or applied to the semiconductor light-emitting diodes 1050. The spacing can be several millimeters to several tens of micrometers from the outermost part of the substrate 161.

Next, a magnetic force is applied to the semiconductor light-emitting diodes 1050 so that the semiconductor light-emitting diodes 1050 move in one direction within the assembly chamber 162. For example, the magnets 163 can move in a horizontal, clockwise, or counterclockwise direction to the substrate 161 (see FIG. 8C). In this case, the semiconductor light-emitting diodes 1050 are moved horizontally to the substrate 161 by the magnetic force, spaced apart from the substrate 161.

Next, the semiconductor light-emitting diodes 1050 are guided to preset positions on the substrate 161 by applying an electric field so that the semiconductor light-emitting diodes 1050 are mounted at the preset positions while in the process of being moved (see FIG. 8C). For example, the semiconductor light-emitting diodes 1050 are moved vertically to the substrate 161 by the electric field and mounted at preset positions on the substrate 161, while being moved horizontally to the substrate 161.

More specifically, an electric field is generated by supplying power to bi-planar electrodes on the substrate 161, and the semiconductor light-emitting diodes 1050 are guided to the preset positions and assembled only there by the electric field. That is, the semiconductor light-emitting diodes 1050 are self-assembled at an assembly site on the substrate 161 by a selectively generated electric field. To this end, the substrate 161 can be formed with cells into which the semiconductor light-emitting diodes 1050 are fitted.

Afterwards, the unloading of the substrate 161 is performed, thereby completing the assembly process. In a case where the substrate 161 is an assembly substrate, an array of semiconductor light-emitting diodes can be transferred onto a wiring substrate to carry out a subsequent process for realizing the display device, as described previously.

Meanwhile, after the semiconductor light-emitting diodes 1050 are guided to the preset positions, the magnets 163 can be moved in a direction in which they get farther away from the substrate 161, so that the semiconductor light-emitting diodes 1050 remaining in the assembly chamber 162 fall to the bottom of the assembly chamber 162 (see FIG. 8D). In another example, if power supply is stopped in a case where the magnets 163 are electromagnets, the semiconductor light-emitting diodes 1050 remaining in the assembly chamber 162 fall to the bottom of the assembly chamber 162.

Thereafter, the semiconductor light-emitting diodes 1050 on the bottom of the assembly chamber 162 can be collected, and the collected semiconductor light-emitting diodes 1050 can be re-used.

In the above-described self-assembly device and method, parts distant from one another are concentrated near a preset assembly site by using a magnetic field in order to increase assembly yields in a fluidic assembly, and the parts are selectively assembled only at the assembly site by applying an electric field to the assembly site. In this case, the assembly substrate is positioned on top of a water tank, with its assembly surface facing downward, thus minimizing the effect of gravity from the weights of the parts and avoiding non-specific binding and eliminating defects.

As seen from above, with the above configuration according to the present disclosure, large numbers of semiconductor light-emitting diodes can be assembled at a time on a display device where individual pixels are made up of semiconductor light-emitting diodes.

As such, according to the present disclosure, large numbers of semiconductor light-emitting diodes can be pixelated on a small-sized wafer and then transferred onto a large-area substrate. This enables the manufacture of a large-area display device at a low cost.

When the self-assembly process described above is performed, several problems occur.

Firstly, as an area of the display increases, an area of the assembly substrate increases. As the area of the assembly substrate increases, there is a problem that a warpage phenomenon of the substrate increases. When a self-assembly is performed in a state in which the assembly substrate is warped, since the magnetic field at the surface of the assembly substrate is not uniformly formed or applied, it is difficult to perform the self-assembly stably.

Secondly, since the semiconductor light-emitting diodes may not be completely uniformly dispersed in the fluid and the magnetic field formed at the surface of the assembly substrate may not be uniform completely, a problem that the semiconductor light-emitting diodes are concentrated only at a partial region of the assembly substrate can occur.

The present disclosure provides a self-assembly device capable of solving the above-described problems and increasing a self-assembly yield.

The self-assembly device according to the present disclosure can include a substrate surface treatment part, a substrate chuck 200, a magnetic field forming part 300, a chip supply part 400, and an assembly chamber 500. However, the present disclosure is not limited thereto, and the self-assembly device according to the present disclosure can include more or less components than those described above.

Prior to describing the self-assembly device according to the present disclosure, a method for self-assembly using the self-assembly device according to the present disclosure will be described briefly.

FIG. 10 is a flowchart showing a method for self-assembly according to the present disclosure.

First, a surface treatment step S110 of an assembly substrate is performed. The step is not essential, but when a surface of the substrate is hydrophilized, it is possible to prevent bubbles from being generated on the surface of the substrate.

Next, a step S120 of loading the assembly substrate onto the substrate chuck is performed. The assembly substrate loaded on the substrate chuck 200 is transferred to an assembly position of the assembly chamber. Thereafter, the magnetic field forming part approaches the assembly substrate through vertical and horizontal movements.

In such a state, a step S130 of supplying a chip is performed. Specifically, a step of dispersing the semiconductor light-emitting diode on the assembly surface of the assembly substrate is performed. When the semiconductor light-emitting diode is dispersed near the assembly surface in a state in which the magnetic field forming part 300 is close enough to the assembly substrate, the semiconductor light-emitting diodes adhere to the assembly surface by the magnetic field forming part. The semiconductor light-emitting diodes are dispersed onto the assembly surface at an appropriate dispersion.

However, the present disclosure is not limited thereto, and the semiconductor light-emitting diode can be dispersed into the fluid in the assembly chamber before the substrate is transferred to the assembly position. That is, a time point at which the chip supply step S130 is performed is not limited to after the assembly substrate is transferred to the assembly position.

A method of supplying the semiconductor light-emitting diode can vary according to an area of the assembly substrate, a type of the semiconductor light-emitting diode to be assembled, and a self-assembly speed.

Thereafter, a step S140 of performing the self-assembly and collecting the semiconductor light-emitting diode is performed. The self-assembly will be described later together with a description of a self-assembly device according to the present disclosure. Meanwhile, the semiconductor light-emitting diode is not necessarily collected after the self-assembly. After the self-assembly is completed, the semiconductor light-emitting diode in the assembly chamber is replenished, and then a new substrate can be used to self-assemble the semiconductor light-emitting diode.

Lastly, after the self-assembly is completed, a step S150 of inspecting and drying the assembly substrate, and separating the substrate from the substrate chuck can be performed. The inspection of the assembly substrate can be performed at the position in which the self-assembly has been performed, and can be performed after the assembly substrate is transferred to another position.

Meanwhile, the drying of the assembly substrate can be performed after the assembly substrate is separated from the fluid. After the drying of the assembly substrate, a post process of the self-assembly can be performed.

Contents of a basic principle of the self-assembly, a structure of the substrate (or assembly substrate), and the semiconductor light-emitting diode are replaced with those described in FIGS. 1 to 9. Meanwhile, since a vertical moving part, a horizontal moving part, a rotating part, and other moving means described below can be implemented through several known means such as a motor and a ball screw, a rack gear and a pinion gear, and a pulley and a timing belt, and the like, detailed descriptions thereof will be omitted.

Meanwhile, the controller 172 described in FIG. 7 controls movements of the vertical moving part, the horizontal moving part, the rotating part, and other moving means provided in the above-described components. That is, the controller 172 is configured to control movements of x, y, and z axes and a rotating movement of each component. Even though not mentioned separately in the specification, the movements of the vertical moving part, the horizontal moving part, the rotating part, and other moving means are generated by the control of the controller 172.

Meanwhile, the electrode 161c provided at the substrate (or assembly substrate 161) described in FIGS. 6 to 9 is referred to as an assembly electrode, the assembly electrode 161c is electrically connected to the power supply 171 described in FIG. 7 via the substrate chuck 200, and the power supply 171 supplies power to the assembly electrode 161c by the control of the controller 172. Detailed description thereof will be described later.

Hereinafter, the above-described components will be described.

First, a substrate surface treatment part serves to hydrophilize a substrate surface. Specifically, the self-assembly device according to the present disclosure performs a self-assembly in a state in which the assembly substrate is in contact with a fluid surface. When the assembly surface of the assembly substrate has a heterogeneous property with the fluid surface, bubbles and the like can occur at the assembly surface, and non-specific coupling between the semiconductor light-emitting diode and the assembly surface can occur. To prevent this, the substrate surface can be treated with fluid-friendly properties before the self-assembly.

In one embodiment, when the fluid is a polar material such as water, the substrate surface treatment part can hydrophilize the assembly surface of the substrate.

For example, the substrate surface treatment part can include a plasma generator. Hydrophilic functional groups can be formed at the substrate surface by plasma treatment of the substrate surface. Specifically, the hydrophilic functional groups can be formed at at least one of a partition wall and a dielectric layer provided at the substrate by the plasma treatment.

Meanwhile, different surface treatments can be performed at a partition wall surface and a surface of the dielectric layer exposed to the outside by a cell so as to prevent non-specific coupling of the semiconductor light-emitting diode. For example, a hydrophilic treatment can be performed at the surface of the dielectric layer exposed to the outside by the cell, and a surface treatment can be performed to form hydrophobic functional groups at the surface of the partition wall. Accordingly, non-specific coupling of the semiconductor light-emitting diode with respect to the surface of the partition wall can be prevented, and the semiconductor light-emitting diode can be strongly fixed inside the cell.

However, the substrate surface treatment part is not an essential component in the self-assembly device according to the present disclosure. The substrate surface treatment part need not be necessary depending on a material configuring the substrate.

The substrate at which the surface treatment is completed by the substrate surface treatment part is loaded onto a substrate chuck 200.

Next, the substrate chuck 200 will be described.

FIG. 11 is a conceptual diagram showing a first state of a substrate chuck, FIG. 12 is a conceptual diagram showing a second state of the substrate chuck, FIG. 13 is a plan view of a first frame provided at the substrate chuck, and FIG. 14 is a conceptual diagram showing a state in which an assembly substrate is loaded at the substrate chuck.

Referring to the accompanying drawings, the substrate chuck 200 includes a substrate support part 205. In one embodiment, the substrate support part 205 can include first and second frames 210 and 220 and a fixing part 230. The first and second frames 210 and 220 are disposed at upper and lower sides of the loaded substrate interposed therebetween, and the fixing part 230 supports the first and second frames 210 and 220. The substrate chuck 200 can include all of a rotating part 240, a vertical moving part 250, and a horizontal moving part. As shown in FIG. 11, the vertical moving part 250 and the horizontal moving part can be formed as one device as a moving part 250, but such is not required, and the vertical moving part and the horizontal moving part can be formed separately. Meanwhile, the present disclosure is not limited to drawings described below, and the rotating part, the vertical and horizontal moving parts provided at the substrate chuck can be formed as one device.

In the present specification, the first frame 210 is defined as a frame disposed at a lower side of the substrate in a state in which the assembly surface of the substrate S faces a fluid, and the second frame 220 is defined as a frame disposed at an upper side of the substrate in a state in which the assembly surface of the substrate faces the fluid. The upper and lower sides relation between the first frame 210 and the second frame 220 can be switched with each other due to the rotating part 240. In the present specification, a state in which the first frame 210 is under the second frame 220 is defined as a first state (see FIG. 11), and a state in which the first frame 210 is over the second frame 220 is defined as a second state (see FIG. 12). The rotating part 240 rotates at least one of the first and second frames 210 and 220 and the fixing part 230 to switch from any one of the first and second states to the other. The rotating part 240 will be described later.

The first frame 210 is a frame in contact with the fluid filled in the assembly chamber during self-assembly. Referring to FIG. 14, the first frame 210 includes a bottom portion 210' and a sidewall portion 210".

The bottom portion 210' serves to support the substrate at the lower side or the upper side of the substrate S when the substrate S is loaded. The bottom portion 210' can be formed in one plate shape, or can be formed in a form in which a plurality of members forming a plate shape are coupled to each other. Referring to FIG. 13, the bottom portion 210' includes a hole 210' passing through a central portion. The hole 210''' can expose a substrate (which will be described later) to the outside to be in contact with the fluid. That is, the hole 210' defines the assembly surface of the substrate. The substrate is loaded such that four corners of the rectangular substrate are mounted on an edge of the hole 210''' of the first frame 210. Accordingly, a remaining region except the edge of the substrate is overlapped with the hole 210''' provided at the first frame 210. The region of the substrate overlapped with the hole 210' becomes an assembly surface.

Meanwhile, a sealing part 212 and an electrode connection part 213 can be disposed adjacent the edge of the hole 210''''.

The sealing part 212 is in close contact with the substrate to prevent the fluid filled in the assembly chamber from penetrating into the first and second frames 210 and 220 during self-assembly. In addition, the sealing part 212 prevents the fluid from penetrating into the assembly electrode 161c and the electrode connection part 213. For this, the sealing part 212 should be disposed at a position closer to the hole 210' than the electrode connection part 213.

The sealing part 212 is formed in a ring shape, and a material of the sealing part 212 is not particularly limited. The material forming the sealing part 212 can be a known sealing material.

The electrode connection part 213 is connected to the assembly electrode formed at the substrate to supply a power to the assembly electrode. In one embodiment, the electrode connection part 213 can apply a power supplied from the power supply 171 described in FIG. 7 to the assembly electrode 161c to form an electric field on the substrate.

Meanwhile, the sidewall portion 210" is formed at an edge of the bottom portion 210'. The sidewall portion 210" prevents the fluid from penetrating into an opposite surface of the assembly surface of the substrate during self-assembly. Specifically, the self-assembly device according to the present disclosure performs self-assembly in a state in which the substrate is submerged in the fluid. The sidewall portion 210" prevents the fluid from penetrating into the opposite surface of the assembly surface of the substrate when the substrate is submerged in the fluid.

For this, the sidewall portion 210" is formed to surround an entire edge of the substrate. A height of the sidewall portion 210" should be greater than a depth at which the substrate is submerged in the fluid. The sidewall portion 210" prevents the fluid from penetrating into the opposite surface of the assembly surface of the substrate, and thus the substrate is prevented from being damaged, and buoyancy of the fluid is applied to only one surface of the substrate. This will be described later.

Meanwhile, the second frame 220 serves to press the substrate at the opposite side of the first frame 210 during self-assembly. Like the first frame 210, the second frame 220 includes a hole passing through a central portion. The hole formed at the second frame 220 is formed to have a size equal to or larger than the hole 210''' formed at the first frame 210.

The hole formed at the second frame 220 allows the opposite surface of the assembly surface of the substrate to be exposed to the outside. The opposite surface of the assembly surface of the substrate should be exposed to the outside in the same area as the assembly surface or in a larger area than the assembly surface. This is because the magnetic field forming part 300 forms a magnetic field at the opposite side of the assembly surface of the substrate. The opposite surface of the assembly surface of the substrate should be exposed to the outside such that the magnetic field forming part 300 can sufficiently approach the substrate.

Meanwhile, the substrate S is loaded between the first and second frames 210 and 220 in the second state. Accordingly, the substrate S is slid and loaded at one surface of the second frame 220. A protrusion for guiding an alignment position of the substrate can be formed at at least one of the first and second frames such that the substrate is aligned to a correct position. In one embodiment, referring to FIG. 13, a protrusion 211 guiding the alignment position of the substrate S can be formed at the first frame 210.

Meanwhile, when the substrate S is loaded on the second frame 220, at least one of the first and second frames 210 and 220 moves vertically such that the first and second frames 210 and 220 press the substrate. For this, the substrate chuck 200 can include a frame moving part disposed at least one of the fixing part 230, and the first and the second frames 210 and 220. At this time, the sealing part 212 presses the substrate S.

In one embodiment, a frame moving part for vertically moving the second frame 220 can be disposed at the fixing part 230. While the substrate chuck is in the second state, when the substrate S is loaded on the second frame 220, the vertical moving part moves the second frame 220 upwardly such that the substrate S can be strongly fixed between the first and second frames 210 and 220. At this time, the electrode connection part 213 provided at the first frame 210 is connected to the assembly electrode of the substrate S, and the sealing part 212 provided at the first frame 210 presses the edge of the substrate S. In this state, when the substrate chuck switches to the first state, the substrate chuck has a shape as shown in FIG. 14.

However, the present disclosure is not limited thereto, and the frame moving part can be formed so as to move any one of the first and second frames 210 and 220 horizontally with respect to the other. In this case, the frame moving part is formed so as to move any one of the first and second frames 210 and 220 vertically and horizontally with respect to the other. When any one of the first and second frames 210 and 220 can be moved horizontally with respect to the other, a connection part between the electrode connection part 213 and the assembly electrode can be changed. It can be used to detect whether the assembled electrode is defective.

Meanwhile, the rotating part 240 is disposed at one side of the fixing part 230 provided at the substrate chuck 200 described above. The rotating part 240 rotates the fixing part 230 such that the upper and lower-sides relation of the first and second frames 210 and 220 can be switched to each other. The substrate chuck 200 is switched from any one of the first and second states to the other by rotating movement of the rotating part 240. A rotation speed, a degree of rotation, a rotation direction, and the like of the rotating part 240 can be controlled by the controller 172 described in FIG. 7.

In one embodiment, the substrate chuck 200 is in the second state before the substrate S is loaded, and the controller 172 controls the rotating part 240 to rotate the fixing part 230 to 180 degrees after the substrate S is loaded such that the substrate chuck 200 is switched to the first state.

Meanwhile, a vertical moving part and a horizontal moving part are disposed at one side of the fixing part 230.

The horizontal moving part moves at least one of the fixing part 230, and the first and second frames 210 and 220 such that the assembly surface of the substrate can be aligned at an open position of the assembly chamber after the substrate is loaded.

The vertical moving part moves at least one of the fixing part 230, and the first and second frames 210 and 220 such that the vertical distance between the substrate and the assembly chamber is adjusted. A warpage phenomenon of the substrate S can be corrected by the vertical moving part. This will be described later.

In summary, the substrate S is loaded in the second state of the substrate chuck 200 (see FIG. 12). Thereafter, the substrate chuck 200 is switched to the first state (see FIG. 11) and then aligned with the assembly chamber. In this process, the substrate chuck 200 moves vertically and horizontally such that the assembly surface of the substrate S is in contact with the fluid filled in the assembly chamber. Thereafter, the controller 172 controls the magnetic field forming part 300.

Next, the magnetic field forming part 300 will be described.

FIG. 15 is a perspective view of a magnetic field forming part according to one embodiment of the present disclosure, FIG. 16 is one side view of a magnetic field forming part according to one embodiment of the present disclosure, FIG. 17 is a bottom side view of a magnetic field forming part according to one embodiment of the present disclosure, and FIG. 18 is a conceptual diagram showing a trajectory of magnets provided at a magnetic field forming part according to the present disclosure.

Referring to the drawings, the magnetic field forming part 300 includes a magnet array 310, a vertical moving part 320, a horizontal moving part 320, and a rotating part 320. The magnetic field forming part 300 is disposed at an upper side of the assembly electrode to serve to form a magnetic field.

Specifically, the magnet array 310 includes a plurality of magnets 313. Each magnet 313 provided at the magnet array 310 can be a permanent magnet or an electromagnet. The magnets 313 serves to form a magnetic field so that the semiconductor light-emitting diodes are led to the assembly surface of the substrate.

The magnet array 310 can include a support part 311 and a magnet moving part 312. The support part 311 is connected to parts 320 that can include a vertical moving part 320, a horizontal moving part 320, and a rotating part.

Meanwhile, one end of the magnet moving part 312 is fixed to the support part 311, and the magnet 313 is fixed to the other end of the magnet moving part 312. The magnet moving part 312 is formed to be stretchable in length, and as the magnet moving part 312 is stretched, a distance between the magnet 313 and the support part 311 changes.

As shown in the accompanying drawings, the magnet moving part 312 can be configured to vertically move the magnets 313 disposed in one row at a time. In this case, the magnet moving part 312 can be disposed for each column of the magnet array.

On the other hand, the magnet moving part 312 can be disposed by the number of magnets provided in the magnet array. Accordingly, a distance between each of a plurality of magnets and the support part can be adjusted differently.

The plurality of magnet moving parts serves to adjust finely a gap between the magnet 313 and the substrate S, and when the substrate is warped, serves to adjust uniformly the gaps between the magnets 313 and the substrate S. Self-assembly can be performed in a state in which the magnet 313 is in contact with the substrate S, or can be performed in a state in which the magnet 313 is spaced apart from the substrate S at a predetermined distance.

Meanwhile, the horizontal moving part can include a rotating part. When the self-assembly is performed, the horizontal moving part provided at the magnetic field forming part 300 moves the magnet in one direction and rotates the magnet, simultaneously. Accordingly, the magnet array 310 rotates with respect to a predetermined rotation axis and moves along one direction, simultaneously. For example, referring to FIG. 18, the magnet 313 provided at the magnet array 310 can move while drawing a trajectory P mixed with a curved line and a straight line.

The semiconductor light-emitting diode can be supplied in a state in which the magnetic field forming part 300 is close to the substrate S within a predetermined distance.

FIG. 19 is a conceptual diagram showing a state in which a semiconductor light-emitting diode is supplied.

Referring to FIG. 19, a chip supply part 400 can be disposed in an assembly chamber 500 to be described later. The substrate S is aligned with the assembly chamber 500, and then the chip supply part 400 serves to supply the semiconductor light-emitting diode to the assembly surface of the substrate S. Specifically, the chip supply part 400 can include a chip accommodating part that can accommodate a chip at an upper portion thereof, a vertical moving part, and a horizontal moving part. The vertical and horizontal moving parts allow the chip accommodating part to move in the fluid filled in the assembly chamber.

The plurality of semiconductor light-emitting diodes can be loaded at the chip accommodating part. After the substrate is aligned with the assembly chamber, when the magnetic field forming part 300 is brought close to the substrate within a predetermined distance, a magnetic field of a predetermined intensity or more is formed on the assembly surface. In this state, when the chip accommodating part is brought close to the assembly surface within the predetermined distance, the semiconductor light-emitting diodes loaded at the chip accommodating part are in contact with the substrate. The vertical moving part provided at the chip supply part brings the chip accommodating part close to a partial region of the assembly surface of the substrate within the predetermined distance through vertical movement.

After a predetermined time passes, the vertical moving part provided at the chip supply part allows the chip accommodating part to be separated from the partial region of the assembly surface of the substrate at the predetermined distance or longer through vertical movement. Thereafter, the horizontal moving part provided at the chip supply part moves horizontally the chip accommodating part such that the chip accommodating part is overlapped with a different region from the partial region of the assembly surface. Thereafter, the vertical moving part provided at the chip supply part brings the chip accommodating part close to the different region within the predetermined distance through vertical movement. By repeating such a process, the chip supply part brings the plurality of semiconductor light-emitting diodes into contact with an entire region of the assembly surface of the substrate. Self-assembly can be performed in a state in which the plurality of semiconductor light-emitting diodes are constantly dispersed and in contact with the entire region of the assembly surface of the substrate.

As described above, there are largely two problems in self-assembly. A second problem is that since the semiconductor light-emitting diodes need not be completely uniformly dispersed in the fluid and the magnetic field formed at the surface of the assembly substrate need not be perfectly uniform, there is a problem that the semiconductor light-emitting diodes are concentrated only at a partial region of the assembly substrate. When using the chip supply part 400 described above, it is possible to solve the second problem described above.

However, the present disclosure is not limited thereto, and the chip supply part is not an essential component of the present disclosure. Self-assembly can be performed in a state in which the semiconductor light-emitting diode is dispersed in the fluid, or in a state in which the plurality of semiconductor light-emitting diodes are dispersed and in contact with the assembly surface of the substrate by another part which is not the chip supply part.

Next, the assembly chamber 500 will be described.

FIG. 20 is a plan view of an assembly chamber according to one embodiment of the present disclosure, FIG. 21 is a cross-sectional view taken along line A-A' of FIG. 20, and FIG. 22 is a perspective view of an assembly chamber according to embodiment of the present disclosure, and FIGS. 23 and 24 are conceptual views illustrating an assembly chamber having a buffer area.

The assembly chamber 500 includes a space for accommodating a plurality of semiconductor light-emitting diodes. The space can be filled with a fluid, and the fluid can include water, and the like as an assembly solution. Therefore, the assembly chamber 500 can be a water tank, and can be configured as an open type. However, the present disclosure is not limited thereto, and the space of the assembly chamber 500 can be a closed type formed in a closed space.

In the assembly chamber 500, a substrate S is disposed such that an assembly surface at which the semiconductor light-emitting diodes 150 are assembled is faced downwardly. For example, the substrate S is transferred to an assembly position by the substrate chuck 200.

At this time, the assembly surface of the substrate S at the assembly position faces a bottom of the assembly chamber 500. Accordingly, the assembly surface is toward a direction of gravity. The assembly surface of the substrate S is disposed to be submerged in the fluid in the assembly chamber 500.

In one embodiment, referring to FIGS. 22 to 22, the assembly chamber 500 can be divided into two regions. Specifically, the assembly chamber 500 can be divided into an assembly region 510 having a plate 511 and an inspection region 520 having a plate 512. In the assembly region 510, the semiconductor light-emitting diode disposed in the fluid is assembled to the substrate S in a state in which the substrate S is submerged in the fluid.

However, the present invention is not limited thereto, and the assembly chamber 500 may be divided into a plurality of regions. Specifically, the assembly chamber 500 may be divided into a plurality of assembly regions and inspection regions. In this case, different types of semiconductor light emitting devices may be assembled in each assembly region. For example, the assembly chamber 500 may have three assembly regions 510a. 510B, 510C. Blue, red, and green semiconductor light emitting devices may be sequentially assembled in a respective assembly region 510c, 510a, 510b.

In this specification, for convenience of description, the structure of the assembly chamber having one assembly region and one inspection region is described, but the present disclosure is not limited thereto, and the assembly chamber may include a plurality of assembly regions and a plurality of inspection regions.

On the other hand, in the inspection region 520, the substrate S that has been self-assembled is inspected. Specifically, the substrate S is assembled at the assembly region and then transferred to the inspection region via the substrate chuck.

On the other hand, in the case of a plurality of assembly regions, when self-assembly in one assembly region is completed, the substrate chuck transfers the substrate to another assembly region.

When a substrate is transferred to another region within the assembly chamber, the substrate is preferably transferred in a state immersed in a fluid. Specifically, the assembly region 510 and the inspection region 520 may be filled with the same fluid. When the substrate S disposed in the assembly region 510 is taken out of the fluid, the pre-assembled semiconductor light emitting device may be separated from the substrate due to surface energy between the fluid and the semiconductor light emitting device. For this reason, it is preferable that the substrate is transferred in a state immersed in the fluid.

On the other hand, when the boundary between regions in the assembly chamber is removed to transfer the substrate to different regions in a state in which the substrate is immersed in the fluid, a problem arises that the semiconductor light emitting device floating in the fluid moves to an unwanted region. For example, the red semiconductor light emitting device may be in a floating state in an assembly region for assembling the red semiconductor light emitting device among the plurality of assembly regions. In this state, when there is no boundary between the assembly regions, the red semiconductor light emitting device may freely move to another assembly region. The red semiconductor light emitting device may move to another assembly region and cause a mis-assembly.

As described above, the regions 510a, 510b, 510c provided in the assembly chamber should be separated from each other, and when transferring the substrates to different regions, the substrates should be kept submerged in the fluid. Previously, as shown in FIGS. 23 and 24, a structure having buffer areas B, B1 and B2 between different areas has been used, but the size of the assembly chamber unnecessary becomes big due to the buffer areas B, B1 and B2. In addition, since the buffer areas B, B1, and B2 must be disposed between all areas, as the number of regions provided in the assembly chamber increases, the number of buffer areas also increases.

The present invention provides an assembly chamber that can minimize the size of the assembly chamber, separate regions provided in the assembly chamber from each other, and enable movement between regions while a substrate is immersed in a fluid.

Hereinafter, the structure of the assembly chamber will be described in detail.

FIG. 25 is a conceptual diagram illustrating an assembly chamber including a gate part, FIG. 26 is an enlarged view of a gate part provided in the assembly chamber according to the present invention, FIG. 27 is a conceptual diagram emphasizing the bottom and sidewalls of the assembly chamber according to the present invention, and FIG. 28 is a conceptual diagram emphasizing the gate part according to the present invention.

Referring to the drawings, the assembly chamber according to the present invention may include a bottom portion 501, a side wall portion 502, and a partition wall part 530.

The bottom portion 501 is formed in a plate shape, and components constituting the assembly chamber may be disposed in some areas of the bottom portion 501.

In an embodiment, a light transmitting part 503 may be disposed on a part of the bottom portion 501. Specifically, the bottom portion 501 may be made of an opaque material. A portion of the bottom portion 501 may be configured to allow light transmission so that the inside of the assembly chum can be observed from the outside of the assembly chamber. To this end, a hole penetrating through the bottom portion 501 may be formed in the bottom portion 501. A light transmitting part 503 may be fastened to the edge of the hole.

Since the assembly chamber is filled with a fluid, when there is a gap between the bottom portion 501 and the light transmitting part 503, the fluid may escape through the gap. Therefore, a complete sealing must be made between the bottom portion 501 and the light transmitting part 503. To this end, a sealing part may be disposed between the bottom portion 501 and the light transmitting part 503.

The light transmitting part 503 may be disposed for each area provided in the assembly chamber. That is, the light transmitting part 503 may be provided as many as the number of regions provided in the assembly chamber. The self-assembly situation can be observed from the outside of the assembly chamber through the light-transmitting part 503.

Meanwhile, a plurality of holes may be formed in the bottom portion 501 for arranging components. A seal must be maintained between the disposed components and the bottom 501 to prevent fluid from escaping into the holes.

Meanwhile, a side wall portion 502 may be formed on the bottom portion 501. The side wall portion 502 may be formed at a predetermined height on the bottom portion 501 and may be disposed on the edge of the bottom portion 501. A fluid may be filled in the space enclosed by the bottom portion 501 and the side wall portion 502. The fluid should not escape between the bottom portion 501 and the side wall portion 502. To this end, the bottom portion 501 and the side wall portion 502 may be integrally manufactured or completely coupled through welding or the like. However, the present invention is not limited thereto, and the coupling method between the bottom portion 501 and the side wall portion 502 is sufficient as long as the coupling method prevents the fluid from escaping between the bottom portion 501 and the side wall portion 502.

Meanwhile, a plurality of holes may be formed in the sidewall portion 502 for arranging components. A seal must be maintained between the disposed components and the sidewall portion 502 to prevent fluid from escaping into the holes.

In the space enclosed by the bottom portion 501 and the side wall portion 502, not only the fluid but also other components may be disposed. Specifically, the partition wall part 530 may be disposed in the space surrounded by the bottom portion 501 and the sidewall portion 502.

The partition wall part 530 may be formed on the bottom portion 501, and can extend to from one of a plurality of inner surfaces provided in the side wall portion 502 to the other inner surface facing the one of the plurality of inner surfaces.

A plurality of regions provided in the assembly chamber may be divided based on the partition wall part 530. In an embodiment, when the assembling chamber has four regions 510a, 510b, 510c, 510d and the four regions are arranged in a line, a total of three partition walls may be arranged in the assembly chamber each with a gate G1, G2 and G3, respectively. However, the present invention is not limited thereto, and the shape of the partition wall part 530 may vary according to an arrangement method of the plurality of regions.

On the other hand, when the partition wall part 530 is formed at the same height as the side wall portion 502, a plurality of regions can be completely separated, but in order for the substrate to be transferred to different regions, the partition wall part 530 is to be separated from the fluid at least once.

On the other hand, when at least a portion of the partition wall part 530 is formed at a height lower than the side wall portion 502 (more precisely, a height lower than the level of the fluid), it is not needed to separate from the fluid when the substrate is transferred to different areas. However, as the fluids filled in different regions may be mixed, the semiconductor light emitting device floating in the fluid may penetrate into the unwanted region.

In order to solve the above two problems, at least a portion of the partition wall part 530 is made to have a vertical height with respect to the bottom portion 501 variable. To this end, the partition wall part 530 may include a frame part 531 and a gate part 532.

The frame part 531 may be fixed to the bottom portion 501. Specifically, the frame part 531 may be fixed on the bottom portion 501 so that the fluid cannot pass between the bottom portion 501 and the frame part 531. The fixing means of the frame part 531 is not specifically limited.

On the other hand, a portion of the frame part 531 may be fixed to the inner surface of the side wall portion 502 and the other inner surface of the side wall portion 502 facing the inner surface. A part of the frame part 531 may be fixed on the inner surface of the side wall portion 502 so that a fluid cannot pass between the side wall portion 502 and the frame part 531. The fixing means of the frame part 531 is not specifically limited.

Meanwhile, a portion of the frame part 531 may be formed to have a height lower than that of the sidewall portion 502 with respect to the bottom portion 501. Specifically, the frame part 531 may include a recess portion formed in the direction of the bottom portion 501. The recess portion may be formed in a central portion of the frame part 531, and a height of the frame part 531 at a position where the recess portion is formed may be lower than that of the sidewall portion 502. Meanwhile, the height of the frame part 531 at the position where the recess portion is not formed may be the same as the height of the sidewall portion 502.

Since the substrate may pass through the recess when moving between regions, the recess is to be formed to a depth sufficient to allow movement between regions while the substrate is immersed in a fluid.

The gate part 532 may be made to be movable along one surface of the frame part 531. Specifically, the gate part 532 is configured to be vertically movable with respect to the bottom portion 501. As the gate part 532 vertically moves, an area overlapping the recess portion changes. When the gate part 532 reaches a position (hereinafter, referred to as a first height) furthest from the bottom portion 501 within the driving range of the gate part 532, the gate part 532 is moved to be completely overlapped with the recess. At this time, the gate part 532 is in close contact with one surface of the frame part 531.

In order to attach the gate part 532 to the frame part 531, a sealing part 533 may be provided on one surface of the gate part 532 in contact with the frame part 531. When the gate part 532 is in close contact with the frame part 531, the fluid cannot pass between the gate part 532 and the frame part 531. The height of the barrier wall part 530 is increased due to the gate part 532.

Conversely, when the gate part 532 descends from the first height and reaches a position closest to the bottom portion 501 (second height) within the driving range of the gate part 532, the gate part 532 may not overlap the recess portion or may overlap only a minimum area. In this state, the gate part 532 does not need to be in close contact with the frame part 531. The height of the barrier wall part 530 may be reduced due to the gate part 532.

The gate part 532 moves from one of the first and second heights to the other through vertical movement. In an embodiment, the gate part 532 may vertically move while being spaced apart from the frame part 531 by a predetermined distance. To this end, the gate part 532 may include not only a vertical movement unit capable of performing vertical movement with respect to the bottom portion 501, but also a horizontal movement unit capable of moving in a horizontal direction to the floor portion 501. A mover 534 is coupled to the gate part 532, and includes at least one of the vertical movement unit and the horizontal movement unit.

For example, when the gate part 532 changes its position from the second height to the first height, the gate part 532 may be s spaced apart from the frame part 531 by a predetermined distance at the second height. In this state, the gate part 532 vertically moves to the first height. Thereafter, the gate part 532 is in close contact with the frame part 531 through horizontal movement with respect to the bottom portion 501.

For example, when the gate part 532 changes its position from a first height to a second height, the gate part 532 is in close contact with the frame part 531 at the first height. In this state, the gate part 532 is spaced apart from the frame part 531 by a predetermined distance through horizontal movement with respect to the bottom portion 501. Thereafter, the gate part 532 vertically moves to the second height.

In this way, the present invention can prevent the sealing part 533 disposed on the gate part 532 from being damaged when the gate part 532 is vertically moved repeatedly. However, the present invention is not limited thereto, and vertical movement may be performed while the gate part 532 is in close contact with the frame part 531. In this case, the gate part 532 may not include a horizontal movement means.

FIGS. 29 and 30 are conceptual views illustrating a change in height of a partition wall portion.

Referring to FIG. 29, during self-assembly, the gate part 532 maintains a state in close contact with the frame part 531 at a first height. Accordingly, since the height of the partition wall part 530 is equal to the height of the side wall portion 502, the fluid filled in the assembly area does not flow into the inspection region. Accordingly, it is possible to prevent the semiconductor light emitting device from being lost to the inspection region during self-assembly.

Meanwhile, as shown in FIG. 30, when the substrate S is transferred, the gate part 532 descends from the first height to remove the boundary between the assembly region 510 and the inspection region 520. Accordingly, the substrate chuck can transfer the substrate from the assembly area to the inspection region only by horizontal movement without a separate vertical movement.

As described above, in the present invention, the height of the barrier wall part 530 may be changed through vertical movement of the gate part 532. Through this, the present invention allows the different regions provided in the assembly chamber to be completely separated, or to move the different regions while the substrate is immersed in the fluid.

Meanwhile, various components may be disposed in the assembly chamber according to the present invention.

FIGS. 31 to 33 are conceptual views emphasizing the components provided in the assembly chamber according to the present invention.

Referring to FIG. 31, a water level sensor 540 capable of sensing a level of a fluid filled in the assembly chamber may be disposed in the assembly chamber. In an embodiment, an ultrasonic sensor capable of sensing a fluid level may be disposed in the assembly chamber.

Through the water level sensor 540, when the fluid is reduced during the process, the fluid may be additionally supplied to maintain a constant level of the fluid. In addition, when the fluid is excessively filled, the level of the fluid can be kept constant by removing the fluid.

To this end, referring to FIG. 32, the assembly chamber according to the present invention may include a fluid supply unit 550a for supplying a fluid and a fluid discharge unit 550b for discharging the fluid. In an embodiment, the fluid supply unit 550a may be disposed on the sidewall portion 502, and the fluid discharge unit 550b may be disposed on the bottom portion 501. Meanwhile, each of the fluid supply unit 550*a* and the fluid discharge unit 550*b* may be disposed in each of the regions provided in the assembly chamber.

Meanwhile, referring to FIG. 33, a sonicator 560 for preventing aggregation of semiconductor light emitting devices may be disposed in the assembly chamber. The sonicator 560 may prevent a plurality of semiconductor light emitting devices from aggregating with each other through vibration.

As described above, according to the present invention, since the height of the partition wall dividing the plurality of regions provided in the assembly chamber can be adjusted, it is possible to prevent the semiconductor light emitting devices floating in each region from mixing with each other while the substrate is immersed in the fluid, and the substrate can be freely move into the respective regions.

The invention claimed is:

1. An assembly chamber containing a fluid, the assembly chamber comprising:
    a bottom portion;
    a side wall portion formed at a predetermined height on the bottom portion and disposed to surround the bottom portion; and
    a partition wall part formed on the bottom portion and extending from one inner surface of a plurality of inner surfaces provided in the side wall portion to another inner surface facing the one inner surface,
    wherein a vertical height of at least a portion of the partition wall part is variable with respect to the bottom portion,
    wherein the assembly chamber includes at least one assembly region to include a first fluid and at least one inspection region to include a second fluid,
    wherein the partition wall part is disposed between the at least one assembly region and the at least one inspection region,
    wherein one side of the partition wall part is in contact with the first fluid in the at least one assembly region and another side of the partition wall part is in contact with the second fluid in the at least one inspection region, and
    wherein top surfaces of the first fluid in the at least one assembly region and the second fluid in the at least one inspection region are disposed below a topmost surface of the partition wall part.

2. The assembly chamber according to claim 1, wherein the partition wall part comprises:
    a frame part fixed to the bottom portion; and
    a gate part movable along one surface of the frame part,
    wherein the vertical height of the at least the portion of the partition wall part is variable as the gate part moves vertically.

3. The assembly chamber according to claim 2, wherein the gate part switches from any one of a first state positioned at a first height to the bottom portion and a second state positioned at a second height lower than the first height.

4. The assembly chamber according to claim 3, wherein the gate part is in contact with the frame part in the first state.

5. The assembly chamber according to claim 4, wherein the gate part is moved to the second state after being spaced a predetermined distance from the frame part in the first state in which the gate part is in contact with the frame part.

6. The assembly chamber according to claim 4, further comprising a sealing part disposed on one surface of the gate part in contact with the frame part.

7. The assembly chamber according to claim 2, wherein the frame part comprises a recess portion therein in a direction of the bottom portion.

8. The assembly chamber according to claim 7, wherein the recess portion is disposed in a central portion of the frame part.

9. The assembly chamber according to claim 8, wherein a height of the frame part at a position where the recess portion is disposed is lower than that of the sidewall portion.

10. The assembly chamber according to claim 2, wherein the gate part comprises:
    a vertical movement unit configured to perform a vertical movement with respect to the bottom portion, and
    a horizontal movement unit configured to perform a horizontal movement with respect to the bottom portion.

11. The assembly chamber according to claim 10, wherein the gate part is in contact with the frame part through the horizontal movement with respect to the bottom portion.

12. The assembly chamber according to claim 2, wherein the gate part is located on the surface of the frame that that face the at least one inspection region.

13. The assembly chamber according to claim 1, further comprising a water level sensor configured to sense a level of the fluid contained in the assembly chamber.

14. The assembly chamber according to claim 13, further comprising:
    a fluid supply part disposed on at least one of the bottom portion and the side wall portion and configured to supply the fluid to the assembly chamber; and
    a fluid discharge part disposed on at least one of the bottom portion and the side wall portion and configured to discharge the fluid to the outside.

15. The assembly chamber according to claim 1, further comprising:
    a sonicator disposed on at least one of the bottom portion and the side wall portion and vibrating the fluid at a predetermined frequency.

16. The assembly chamber according to claim 1, wherein at least a portion of the bottom portion comprises a light-transmitting layer.

17. The assembly chamber according to claim 1,
    wherein, in the at least one assembly region, a plurality of light-emitting diode are assembled onto a substrate, and in the at least one inspection region, the plurality of light-emitting diodes assembled onto the substrate are inspected.

18. The assembly chamber according to claim 17, wherein a plurality of assembly regions are provided for the assembly chamber, and
    wherein each assembly region corresponds to a light-emitting diode of one color.

19. The assembly chamber according to claim 1, wherein a bottom most surface of the partition wall part is disposed at a same or higher level over the bottom portion of the assembly chamber.

* * * * *